United States Patent
Isobe et al.

(10) Patent No.: US 9,660,095 B2
(45) Date of Patent: May 23, 2017

(54) SEMICONDUCTOR DEVICE

(71) Applicant: Semiconductor Energy Laboratory Co., Ltd., Atsugi-shi, Kanagawa-ken (JP)

(72) Inventors: Atsuo Isobe, Isehara (JP); Toshinari Sasaki, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/459,523

(22) Filed: Aug. 14, 2014

(65) Prior Publication Data
US 2015/0014683 A1  Jan. 15, 2015

Related U.S. Application Data

(63) Continuation of application No. 13/446,020, filed on Apr. 13, 2012, now Pat. No. 8,809,854.

(30) Foreign Application Priority Data

Apr. 22, 2011 (JP) ................... 2011-095607

(51) Int. Cl.
*H01L 21/70* (2006.01)
*H01L 29/786* (2006.01)
(Continued)

(52) U.S. Cl.
CPC ........ *H01L 29/7869* (2013.01); *H01L 23/564* (2013.01); *H01L 27/1156* (2013.01); (Continued)

(58) Field of Classification Search
CPC ................... H01L 21/02565; H01L 21/02568
(Continued)

(56) References Cited

U.S. PATENT DOCUMENTS 5,100,822 A    3/1992   Mitani
5,229,310 A * 7/1993   Sivan ................. H01L 27/12
                                                           148/DIG. 150
(Continued)

FOREIGN PATENT DOCUMENTS

EP        0531124 A    3/1993
EP        1737044 A   12/2006
(Continued)

OTHER PUBLICATIONS

Machine Translation of JP-11-177098.*
(Continued)

*Primary Examiner* — Julia Slutsker
(74) *Attorney, Agent, or Firm* — Robinson Intellectual Property Law Office; Eric J. Robinson

(57) ABSTRACT

Stable electric characteristics and high reliability are provided to a miniaturized and integrated semiconductor device including an oxide semiconductor. In a transistor (a semiconductor device) including an oxide semiconductor film, the oxide semiconductor film is provided along a trench (groove) formed in an insulating layer. The trench includes a lower end corner portion having a curved shape with a curvature radius of longer than or equal to 20 nm and shorter than or equal to 60 nm, and the oxide semiconductor film is provided in contact with a bottom surface, the lower end corner portion, and an inner wall surface of the trench. The oxide semiconductor film includes a crystal having a c-axis substantially perpendicular to a surface at least over the lower end corner portion.

29 Claims, 13 Drawing Sheets

(51) Int. Cl.
  *H01L 27/1156* (2017.01)
  *H01L 27/12* (2006.01)
  *H01L 29/423* (2006.01)
  *H01L 23/00* (2006.01)
  *H01L 29/04* (2006.01)

(52) U.S. Cl.
  CPC ........ *H01L 27/1225* (2013.01); *H01L 29/045* (2013.01); *H01L 29/4236* (2013.01); *H01L 2924/0002* (2013.01)

(58) Field of Classification Search
  USPC .......................... 257/244, 302, 43, 296, 330
  See application file for complete search history.

(56) References Cited

U.S. PATENT DOCUMENTS

| | | | |
|---|---|---|---|
| 5,317,432 A | 5/1994 | Ino | |
| 5,567,958 A * | 10/1996 | Orlowski | H01L 27/1108 257/330 |
| 5,731,856 A | 3/1998 | Kim et al. | |
| 5,733,810 A | 3/1998 | Baba et al. | |
| 5,744,864 A | 4/1998 | Cillessen et al. | |
| 5,843,846 A | 12/1998 | Nguyen et al. | |
| 6,001,734 A | 12/1999 | Drynan | |
| 6,107,639 A | 8/2000 | Yamazaki et al. | |
| 6,107,662 A | 8/2000 | Kim | |
| 6,107,687 A | 8/2000 | Fukada et al. | |
| 6,235,570 B1 | 5/2001 | Kang | |
| 6,294,274 B1 | 9/2001 | Kawazoe et al. | |
| 6,515,299 B1 | 2/2003 | Yamazaki et al. | |
| 6,563,174 B2 | 5/2003 | Kawasaki et al. | |
| 6,720,575 B2 | 4/2004 | Yamazaki et al. | |
| 6,727,522 B1 | 4/2004 | Kawasaki et al. | |
| 6,841,797 B2 | 1/2005 | Isobe et al. | |
| 7,022,590 B2 | 4/2006 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,242,041 B2 | 7/2007 | Bucher et al. | |
| 7,282,782 B2 | 10/2007 | Hoffman et al. | |
| 7,297,977 B2 | 11/2007 | Hoffman et al. | |
| 7,307,007 B2 | 12/2007 | Yamazaki et al. | |
| 7,323,356 B2 | 1/2008 | Hosono et al. | |
| 7,361,929 B2 | 4/2008 | Bucher et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,419,858 B2 | 9/2008 | Schuele et al. | |
| 7,439,545 B2 | 10/2008 | Honda | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,463,399 B2 | 12/2008 | Shin et al. | |
| 7,468,304 B2 | 12/2008 | Kaji et al. | |
| 7,501,293 B2 | 3/2009 | Ito et al. | |
| 7,511,343 B2 | 3/2009 | Li et al. | |
| 7,670,887 B2 | 3/2010 | Bucher et al. | |
| 7,674,650 B2 | 3/2010 | Akimoto et al. | |
| 7,732,819 B2 | 6/2010 | Akimoto et al. | |
| 7,755,126 B2 | 7/2010 | Kondo | |
| 7,777,414 B2 | 8/2010 | Honda | |
| 7,872,309 B2 | 1/2011 | Schuele et al. | |
| 7,893,495 B2 | 2/2011 | Li et al. | |
| 8,034,674 B2 | 10/2011 | Nagai et al. | |
| 8,188,472 B2 | 5/2012 | Park et al. | |
| 8,202,365 B2 | 6/2012 | Umeda et al. | |
| 8,247,813 B2 | 8/2012 | Koyama et al. | |
| 8,274,078 B2 | 9/2012 | Itagaki et al. | |
| 8,293,661 B2 | 10/2012 | Yamazaki | |
| 8,324,621 B2 | 12/2012 | Yamazaki et al. | |
| 8,367,489 B2 | 2/2013 | Yamazaki | |
| 8,377,744 B2 | 2/2013 | Yamazaki et al. | |
| 8,492,758 B2 | 7/2013 | Yamazaki et al. | |
| 8,530,285 B2 | 9/2013 | Yamazaki et al. | |
| 8,809,854 B2 * | 8/2014 | Isobe | H01L 27/1156 257/244 |
| 8,816,349 B2 | 8/2014 | Yamazaki et al. | |
| 9,177,855 B2 | 11/2015 | Yamazaki et al. | |
| 9,214,563 B2 | 12/2015 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0170955 A1 * | 9/2003 | Kawamura | H01L 27/10876 438/270 |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2004/0248387 A1 | 12/2004 | Kawasaki et al. | |
| 2005/0017302 A1 | 1/2005 | Hoffman | |
| 2005/0023574 A1 | 2/2005 | Forbes et al. | |
| 2005/0199959 A1 | 9/2005 | Chiang et al. | |
| 2005/0285233 A1 * | 12/2005 | Huang | H01L 29/66765 257/646 |
| 2006/0035452 A1 | 2/2006 | Carcia et al. | |
| 2006/0043377 A1 | 3/2006 | Hoffman et al. | |
| 2006/0063320 A1 * | 3/2006 | Orlowski | H01L 21/823807 438/199 |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0276001 A1 | 12/2006 | Ogawa | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0023698 A1 * | 1/2008 | Li | H01L 29/7869 257/43 |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0057649 A1 * | 3/2008 | Schuele | H01L 29/66621 438/270 |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0121877 A1 | 5/2008 | Ender et al. | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0220620 A1 * | 9/2008 | Kawada | H01L 21/0475 438/795 |
| 2008/0224133 A1 | 9/2008 | Park et al. | |

(56) References Cited

U.S. PATENT DOCUMENTS

| | | |
|---|---|---|
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0001436 A1 | 1/2009 | Kondo |
| 2009/0004852 A1 | 1/2009 | Lieber et al. |
| 2009/0057674 A1* | 3/2009 | Jeong ............... H01L 29/7869 257/59 |
| 2009/0068773 A1 | 3/2009 | Lai et al. |
| 2009/0072232 A1* | 3/2009 | Hayashi ............ H01L 21/28202 257/43 |
| 2009/1007332 | 3/2009 | Kuwabara et al. |
| 2009/0114910 A1 | 5/2009 | Chang |
| 2009/0127552 A1 | 5/2009 | Li et al. |
| 2009/1013439 | 5/2009 | Sakakura et al. |
| 2009/0146261 A1 | 6/2009 | Onodera et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0286351 A1 | 11/2009 | Hirao et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0213461 A1* | 8/2010 | Akimoto ............ H01L 27/1248 257/43 |
| 2010/0301337 A1 | 12/2010 | Rider et al. |
| 2010/0320458 A1 | 12/2010 | Umeda et al. |
| 2010/0320459 A1 | 12/2010 | Umeda et al. |
| 2011/0062436 A1 | 3/2011 | Yamazaki et al. |
| 2011/0068852 A1 | 3/2011 | Yamazaki et al. |
| 2011/0089417 A1 | 4/2011 | Yamazaki et al. |
| 2011/0108837 A1 | 5/2011 | Yamazaki et al. |
| 2011/0127521 A1 | 6/2011 | Yamazaki |
| 2011/0127523 A1 | 6/2011 | Yamazaki |
| 2011/0127579 A1 | 6/2011 | Yamazaki |
| 2011/0133191 A1 | 6/2011 | Yamazaki |
| 2011/0147739 A1 | 6/2011 | Yamazaki et al. |
| 2011/0151618 A1 | 6/2011 | Yamazaki et al. |
| 2011/0284848 A1 | 11/2011 | Yamazaki |
| 2012/0052606 A1 | 3/2012 | Yamazaki |
| 2012/0061663 A1 | 3/2012 | Yamazaki et al. |
| 2012/0064664 A1 | 3/2012 | Yamazaki et al. |
| 2012/0064703 A1 | 3/2012 | Jintyou et al. |
| 2012/0187410 A1 | 7/2012 | Yamazaki et al. |
| 2012/0187417 A1 | 7/2012 | Yamazaki et al. |
| 2012/0187475 A1 | 7/2012 | Yamazaki et al. |
| 2012/0267623 A1 | 10/2012 | Isobe et al. |
| 2012/0267624 A1 | 10/2012 | Isobe et al. |
| 2012/0267696 A1 | 10/2012 | Isobe et al. |
| 2012/0267709 A1 | 10/2012 | Isobe et al. |
| 2012/0270375 A1 | 10/2012 | Sasagawa et al. |
| 2015/0104901 A1 | 4/2015 | Yamazaki et al. |
| 2015/0171195 A1 | 6/2015 | Isobe et al. |

FOREIGN PATENT DOCUMENTS

| | | |
|---|---|---|
| EP | 1921681 A | 5/2008 |
| EP | 2226847 A | 9/2010 |
| JP | 59-124166 A | 7/1984 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-192175 A | 8/1989 |
| JP | 04-032276 A | 2/1992 |
| JP | 04-251926 A | 9/1992 |
| JP | 05-251705 A | 9/1993 |
| JP | 05-297413 A | 11/1993 |
| JP | 06-302825 A | 10/1994 |
| JP | 08-264794 A | 10/1996 |
| JP | 10-261635 A | 9/1998 |
| JP | 11-505377 | 5/1999 |
| JP | 11-177098 A | 7/1999 |
| JP | 11-354445 A | 12/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-019468 A | 1/2007 |
| JP | 2007-506286 | 3/2007 |
| JP | 2007-220820 A | 8/2007 |
| JP | 2008-034760 A | 2/2008 |
| JP | 2008-060524 A | 3/2008 |
| JP | 2008-098637 A | 4/2008 |
| JP | 2008-277665 A | 11/2008 |
| JP | 2009-016368 A | 1/2009 |
| JP | 2009-167087 A | 7/2009 |
| JP | 2009-283862 A | 12/2009 |
| JP | 2010-040815 A | 2/2010 |
| JP | 4415062 | 2/2010 |
| JP | 2010-177431 A | 8/2010 |
| JP | 4571221 | 10/2010 |
| JP | 2011-086923 A | 4/2011 |
| WO | WO-2004/114391 | 12/2004 |
| WO | WO-2005/031845 | 4/2005 |
| WO | WO-2005/093831 | 10/2005 |
| WO | WO-2008/133345 | 11/2008 |
| WO | WO-2011/036999 | 3/2011 |
| WO | WO-2011/043194 | 4/2011 |

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 199, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5) $InGaO_3(ZnO)3$, and $Ga_2O_3(ZnO)m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.

(56) References Cited

OTHER PUBLICATIONS

Nomura.K et al., "Thin-Film Transistor Fabricated in Single-Crystalline Transparent Oxide Semiconductor", Science, May 23, 2003, vol. 300, No. 5623, pp. 1269-1272.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.
Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO) 5 films", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Display", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array", SID Digest '08 : International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits, 2008, vol. 43, No. 1, pp. 292-299.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transistion:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.
Park.J et al., "Amorphous Indium—Gallium—Zinc Oxide TFTs and Their Application for Large Size AMOLED", AM-FPD '09 Digest of Technical Papers, Jul. 2, 2008, pp. 275-278.
Park.S et al., "Challenge to Future Displays: Transparent AM-OLED Driven by Peald Grown ZnO TFT"IMID '07 Digest, 2007, pp. 1249-1252.
Godo.H et al., "Temperature Dependence of Characteristics and Electronic Structure for AMORPHOUS In—Ga—Zn—Oxide TFT", AM-FPD '09 Digest of Technical Papers, Jul. 1, 2009, pp. 41-44.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Miyasaka.M, "Suftla Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N. et al., "Spinel,YBFE2O4, and YB2FE3O7 Types of Structures for Compounds in the IN2O3 and SC2O3—A2O3—BO

(56) References Cited

OTHER PUBLICATIONS

Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello. M et al., "Electron Microscopy of a Cholesteric Liquid and Its Blue Phase", Phys. Rev. A (Physical Review. A), May 1, 1984, vol. 29, No. 5, pp. 2957-2959.

Meibooms.S et al., "Theory of the Blue Phase of Cholesteric Liquid Crystals", Phys. Rev. Lett. (Physical Review Letters), May 4, 1981, vol. 46, No. 18, 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K. et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies In ZnO", Appl. Phys. Lett. (Applied Physics Letters) , 2005, vol. 87, pp. 122102-1-122102-3.

Oba.F et al., "Defect energetics in ZnO: A hybrid Hartee-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosohpical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. pp. 1755-1757.

\* cited by examiner

SEMICONDUCTOR DEVICE

BACKGROUND OF THE INVENTION

1. Field of the Invention

An embodiment of the present invention relates to a semiconductor device and a method for manufacturing the semiconductor device.

In this specification, a semiconductor device generally means a device which can function by utilizing semiconductor characteristics, and an electro-optical device, a semiconductor circuit, and an electronic device are all semiconductor devices.

2. Description of the Related Art

Attention has been focused on a technique for forming a transistor using a semiconductor thin film formed over a substrate having an insulating surface (also referred to as thin film transistor (TFT)). The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor whose active layer includes an amorphous oxide containing indium (In), gallium (Ga), and zinc (Zn) and having an electron carrier concentration of less than $10^{18}/cm^3$ is disclosed (see Patent Document 1).

REFERENCE

[Patent Document 1] Japanese Published Patent Application No. 2006-165528

SUMMARY OF THE INVENTION

Miniaturization has been a road map for technical development in the technical field of semiconductor devices, and thus, the technical field of the semiconductor devices has been developed. As the semiconductor devices have become miniaturized, higher speed operation and lower power consumption have been achieved so far.

However, when a transistor is miniaturized, the problem of a short-channel effect arises. The short-channel effect refers to degradation of electrical characteristics which becomes obvious with miniaturization of a transistor (a reduction in channel length (L)). The short-channel effect results from the effect of an electric field of a drain on a source. Specific examples of the short-channel effect are a decrease in threshold voltage, an increase in S value (subthreshold swing), an increase in leakage current, and the like. The short-channel effect is likely to occur particularly in a transistor including an oxide semiconductor because it is difficult to control the threshold voltage of such a transistor by doping, unlike a transistor including silicon.

In view of the above problems, an object is to provide stable electrical characteristics and high reliability to a miniaturized and integrated semiconductor device including an oxide semiconductor.

In a transistor (a semiconductor device) including an oxide semiconductor film, the oxide semiconductor film is provided along a trench (groove) formed in an insulating layer. The trench includes a lower end corner portion having a curved shape with a curvature radius of longer than or equal to 20 nm and shorter than or equal to 60 nm (preferably, longer than or equal to 20 nm and shorter than or equal to 30 nm), and the oxide semiconductor film is provided in contact with a bottom surface, the lower end corner portion, and an inner wall surface of the trench. The oxide semiconductor film includes a crystal having a c-axis substantially perpendicular to a surface at least over the lower end corner portion.

The cross-sectional shape of the oxide semiconductor film in the channel-length direction is a shape curved along the cross-sectional shape of the trench. With this structure, as the trench becomes deeper, the channel length of a transistor increases. Therefore, the channel length of the oxide semiconductor film can be controlled by appropriately setting the depth of the trench even when the distance between a source electrode layer and a drain electrode layer is decreased; thus, the occurrence of a short-channel effect can be suppressed.

The oxide semiconductor film including a crystal having a c-axis substantially perpendicular to a surface (hereinafter also referred to as crystalline oxide semiconductor film) has neither a completely single crystal structure nor a completely amorphous structure and is a c-axis aligned crystalline oxide semiconductor (CAAC-OS) film having c-axis alignment. With the crystalline oxide semiconductor film, it is possible to provide a highly reliable semiconductor device in which changes of the electrical characteristics of the transistor due to irradiation with visible light or ultraviolet light can be suppressed.

Since the oxide semiconductor film is formed along the trench, the lower end corner portion of the trench should have a curved shape (preferably with a curvature radius of longer than or equal to 20 nm and shorter than or equal to 60 nm (more preferably, longer than or equal to 20 nm and shorter than or equal to 30 nm)). When having a sharp corner, the lower end corner portion may cause the crystalline oxide semiconductor film to have a defective crystal orientation, a defective shape due to a decrease in coverage, or the like, in which case it is difficult to obtain a stable crystal structure and stable electrical conductivity.

In addition, a region of the insulating layer which is in contact with the oxide semiconductor film (at least the lower end corner portion) preferably has a surface with a reduced surface roughness. Specifically, the surface preferably has an average surface roughness of more than or equal to 0.1 nm and less than 0.5 nm. The oxide semiconductor film can have stable and favorable crystallinity when formed on a surface with a reduced surface roughness.

In this specification, average surface roughness ($R_a$) is obtained by three-dimensional expansion of center line average roughness ($R_a$) which is defined by JIS B 0601:2001 (ISO 4287:1997) so that $R_a$ can be applied to a measurement surface, and is an average value of the absolute values of deviations from a reference surface to a specific surface.

Here, the center line average roughness ($R_a$) is shown by the following formula (1) assuming that a portion having a measurement length L is picked up from a roughness curve in the direction of the center line of the roughness curve, the direction of a center line of the roughness curve of the picked portion is represented by an X-axis, the direction of longitudinal magnification (direction perpendicular to the X-axis) is represented by a Y-axis, and the roughness curve is expressed as Y=F(X).

[Formula 1]

$$Ra = \frac{1}{L}\int_0^L |F(X)| dX \qquad (1)$$

When the measurement surface which is a surface represented by measurement data is expressed as Z=F(X,Y), the average surface roughness ($R_a$) is an average value of the absolute values of deviations from the reference surface to the specific surface and is shown by the following formula (2).

[Formula 2]

$$Ra = \frac{1}{S_0} \int_{Y_1}^{Y_2} \int_{X_1}^{X_2} |f(X,Y) - Z_0| dX \, dY \qquad (2)$$

Here, the specific surface is a surface which is an object of roughness measurement, and is a rectangular region which is surrounded by four points represented by the coordinates $(X_1, Y_1)$, $(X_1, Y_2)$, $(X_2, Y_1)$, and $(X_2, Y_2)$. $S_0$ represents the area of the specific surface when the specific surface is flat ideally.

In addition, the reference surface is a surface parallel to an X-Y plane at the average height of the specific surface. That is, when the average value of the height of the specific surface is expressed as $Z_0$, the height of the reference surface is also expressed as $Z_0$.

One embodiment of a configuration of the invention disclosed in this specification is a semiconductor device which includes: a trench provided in an insulating layer and including a lower end corner portion having a curved shape; an oxide semiconductor film in contact with a bottom surface, the lower end corner portion, and an inner wall surface of the trench; a gate insulating layer over the oxide semiconductor film; and a gate electrode layer over the gate insulating layer. The lower end corner portion has a curvature radius of longer than or equal to 20 nm and shorter than or equal to 60 nm. The oxide semiconductor film includes a crystal having a c-axis substantially perpendicular to a surface of the oxide semiconductor film at least over the lower end corner portion.

One embodiment of a configuration of the invention disclosed in this specification is a semiconductor device which includes: a trench provided in an insulating layer and including a lower end corner portion having a curved shape; an oxide semiconductor film in contact with a bottom surface, the lower end corner portion, and an inner wall surface of the trench; a source electrode layer and a drain electrode layer over the oxide semiconductor film; a gate insulating layer over the oxide semiconductor film, the source electrode layer, and the drain electrode layer; and a gate electrode layer over the gate insulating layer. The lower end corner portion has a curvature radius of longer than or equal to 20 nm and shorter than or equal to 60 nm. The oxide semiconductor film includes a crystal having a c-axis substantially perpendicular to a surface of the oxide semiconductor film at least over the lower end corner portion.

In any of the above configurations, a surface of the insulating layer which includes at least the lower end corner portion having a curved shape and which is in contact with the oxide semiconductor film preferably has an average surface roughness of more than or equal to 0.1 nm and less than 0.5 nm.

In addition, in any of the above configurations, the gate electrode layer may be provided so as to fill the trench.

In a semiconductor device having a transistor including an oxide semiconductor film, the oxide semiconductor film is provided along a trench formed in an insulating layer and including a lower end corner portion having a curved shape with a curvature radius of longer than or equal to 20 nm and shorter than or equal to 60 nm (preferably, longer than or equal to 20 nm and shorter than or equal to 30 nm). The channel length of the oxide semiconductor film can be controlled by appropriately setting the depth of the trench even when the distance between a source electrode layer and a drain electrode layer is decreased; thus, the occurrence of a short-channel effect due to miniaturization can be suppressed.

In addition, the oxide semiconductor film includes a crystal having a c-axis substantially perpendicular to a surface at least over the lower end corner portion. With such a crystalline oxide semiconductor film, it is possible to provide a highly reliable semiconductor device in which changes of the electrical characteristics of the transistor due to irradiation with visible light or ultraviolet light can be suppressed.

Thus, in one embodiment of the present invention, it is possible to provide stable electrical characteristics and high reliability to a miniaturized and integrated semiconductor device including an oxide semiconductor and to a manufacturing process for the semiconductor device.

In addition, in one embodiment of the present invention, it is possible to provide a technique for reducing defects and achieving a high yield in the manufacturing process for the semiconductor device.

DETAILED DESCRIPTION OF THE INVENTION

Embodiments of the invention disclosed in this specification will be described in detail below with reference to drawings. Note that the invention disclosed in this specification is not limited to the description below, and it is easily understood by those skilled in the art that modes and details of the present invention can be modified in various ways. In addition, the invention disclosed in this specification should not be construed as being limited to the description in the embodiments given below. Note that ordinal numbers such as "first" and "second" are used for convenience and do not denote the order of steps or the stacking order of layers. In addition, the ordinal numbers in this specification do not denote any particular names to define the invention.

(Embodiment 1)

Figure 1A:
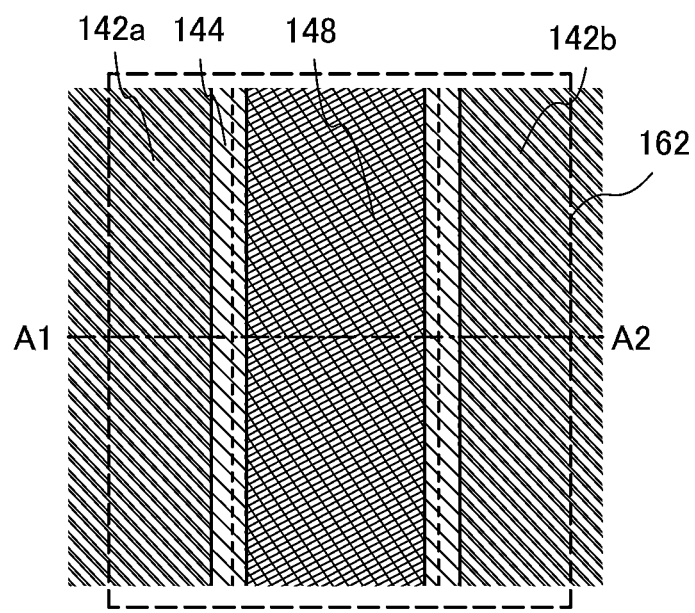
FIGS. 1A and 1B illustrate a semiconductor device.

In this embodiment, one embodiment of a semiconductor device and a method for manufacturing the semiconductor device will be described with reference to FIGS. 1A and 1B, FIGS. 2A to 2D, FIGS. 12A to 12C, FIGS. 13A to 13C, and FIGS. 14A to 14C. In this embodiment, a transistor including an oxide semiconductor film will be described as an example of the semiconductor device. FIG. 1A is a plan view of a transistor 162, and FIG. 1B is a cross-sectional view taken along a dashed line A1-A2 in FIG. 1A and is an example of a cross-sectional view of the transistor 162 in the channel-length (L) direction.

Figure 1B:
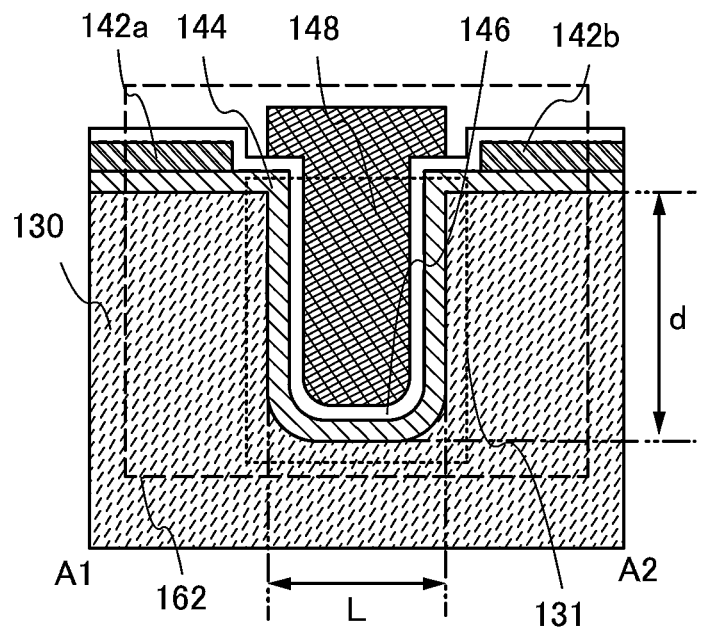

As illustrated in FIGS. 1A and 1B, the transistor 162 includes an insulating layer 130 provided with a trench 131, a crystalline oxide semiconductor film 144, a gate insulating layer 146, an electrode layer 142a and an electrode layer 142b functioning as a source electrode layer and a drain electrode layer, and a gate electrode layer 148. Although not illustrated, the transistor 162 is provided over a substrate.

FIGS. 2A to 2D illustrate an example of a method for manufacturing the transistor 162.

First, an insulating layer is formed using an oxide film over a substrate. Then, a plurality of trenches 131 (also referred to as grooves) is formed in the insulating layer to form an insulating layer 130 provided with the trenches 131. A lower end corner portion 300 of each of the trenches 131 has a curved shape with a curvature radius of longer than or equal to 20 nm and shorter than or equal to 60 nm (preferably, longer than or equal to 20 nm and shorter than or equal to 30 nm) (see FIG. 2A).

As a method for forming the trench 131, a dry etching method using a photolithography method may preferably be used.

For example, it is possible to use a dry etching method such as a reactive ion etching (RIE) method, an inductively coupled plasma (ICP) etching method, an electron cyclotron resonance (ECR) etching method, a parallel-plate (capacitively coupled plasma) etching method, a magnetron plasma etching method, a dual-frequency plasma etching method, or a helicon wave plasma etching method. As an etching gas, a fluorocarbon-based gas such as trifluoromethane ($CHF_3$), tetrafluoromethane ($CF_4$), or perfluorocyclobutane ($C_4F_8$), methane ($CH_4$), hydrogen, and/or a rare gas such as helium or argon can be used in an appropriate combination.

The trench 131 is formed in a single etching step or through a plurality of etching steps. In the case of performing a plurality of etching steps, a dry etching step and a wet etching step may be combined.

Although there is no particular limitation on a substrate which can be used, it is at least necessary that the substrate have heat resistance sufficient to withstand heat treatment performed later. For example, a glass substrate of barium borosilicate glass, aluminoborosilicate glass, or the like, a ceramic substrate, a quartz substrate, a sapphire substrate, or the like can be used.

Alternatively, it is possible to use a single crystal semiconductor substrate or a polycrystalline semiconductor substrate of silicon, silicon carbide, or the like, a compound semiconductor substrate of silicon germanium or the like, an SOI substrate, any of these substrates provided with a semiconductor element, such as a semiconductor substrate provided with a driver circuit including a transistor with a MOSFET structure or a semiconductor substrate provided with a capacitor, or the like.

The insulating layer 130 is in contact with the crystalline oxide semiconductor film 144 and therefore preferably contains a large amount of oxygen which exceeds at least the stoichiometry in (a bulk of) the film. For example, in the case where a silicon oxide film is used as the insulating layer 130, the composition formula is $SiO_{2+\alpha}$ ($\alpha>0$). By using the insulating layer 130 described above, oxygen can be supplied to the crystalline oxide semiconductor film 144 and favorable characteristics can be obtained. By a supply of oxygen to the crystalline oxide semiconductor film 144, oxygen vacancies in the film can be filled.

For example, when an oxide insulating layer containing much (excess) oxygen, which serves as an oxygen supply source, is provided so as to be in contact with the crystalline oxide semiconductor film 144, oxygen can be supplied from the oxide insulating layer to the crystalline oxide semiconductor film 144. The crystalline oxide semiconductor film 144 and the oxide insulating layer may be subjected to a heating step in a state where the crystalline oxide semiconductor film 144 and the oxide insulating layer are at least partly in contact with each other so that oxygen is supplied to the crystalline oxide semiconductor film 144.

Oxygen (including at least any one of oxygen radicals, oxygen atoms, and oxygen ions) may be introduced into the crystalline oxide semiconductor film 144 in order to supply oxygen to the film. Oxygen can be introduced by an ion implantation method, an ion doping method, a plasma immersion ion implantation method, plasma treatment, or the like. Oxygen may be introduced directly into the crystalline oxide semiconductor film 144 in an exposed state, or through the gate insulating layer 146 or the like.

Since the crystalline oxide semiconductor film 144 is formed along the trench 131, the lower end corner portion 300 of the trench 131 should have a curved shape (preferably with a curvature radius of longer than or equal to 20 nm and shorter than or equal to 60 nm (more preferably, longer than or equal to 20 nm and shorter than or equal to 30 nm)). When having a sharp corner, the lower end corner portion 300 may cause the crystalline oxide semiconductor film 144 to have a defective crystal orientation, a defective shape due to a decrease in coverage, or the like, in which case it is difficult to obtain a stable crystal structure and stable electrical conductivity.

In addition, a region of the insulating layer 130 which is in contact with the crystalline oxide semiconductor film 144 (at least the lower end corner portion) preferably has a surface with a reduced surface roughness. Specifically, the surface preferably has an average surface roughness of more than or equal to 0.1 nm and less than 0.5 nm. The crystalline oxide semiconductor film 144 can have stable and favorable crystallinity when formed on a surface with a reduced surface roughness.

Thus, planarization treatment may be performed on a region of the insulating layer 130 which is to be in contact with the crystalline oxide semiconductor film 144. The planarization treatment may be, but not particularly limited to, polishing treatment (such as chemical mechanical polishing (CMP)), dry etching treatment, or plasma treatment.

As plasma treatment, reverse sputtering in which an argon gas is introduced and plasma is generated can be performed. The reverse sputtering is a method in which voltage is applied to a substrate side, not to a target side, in an argon atmosphere by using an RF power supply and plasma is generated in the vicinity of the substrate to modify a surface. Note that instead of the argon atmosphere, a nitrogen atmosphere, a helium atmosphere, an oxygen atmosphere, or the like may be used.

As the planarization treatment, polishing treatment, dry etching treatment, or plasma treatment may be performed plural times, or these treatments may be performed in combination. In the case where the treatments are combined, the order of steps is not particularly limited and may be set as appropriate depending on the roughness of the surface of the insulating layer 130.

Note that before the crystalline oxide semiconductor film 144 is formed, powder substances (also referred to as particles or dust) which are attached to the surface of the insulating layer 130 are preferably removed by reverse sputtering in which an argon gas is introduced and plasma is generated.

In order to prevent the crystalline oxide semiconductor film 144 from containing hydrogen or water much as possible in the step of forming the crystalline oxide semiconductor film 144, it is preferable to preheat the substrate provided with the insulating layer 130 in a preheating chamber of a sputtering apparatus before the formation of the crystalline oxide semiconductor film 144 so that an impurity such as hydrogen or moisture adsorbed on the substrate and the insulating layer 130 is eliminated and expelled from the chamber. As an exhaustion unit provided in the preheating chamber, a cryopump is preferable.

Figure 2A:
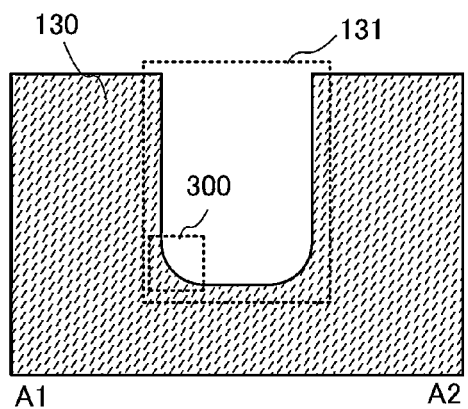
FIGS. 2A to 2D illustrate an embodiment of a method for manufacturing a semiconductor device.
Figure 2B:
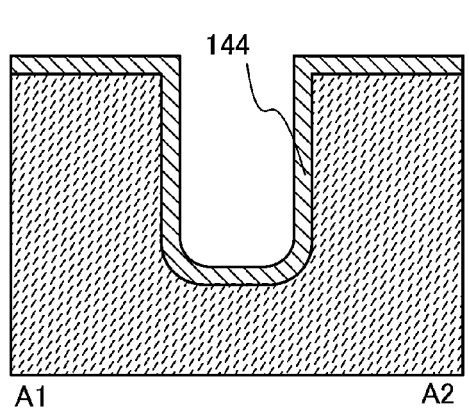
Figure 2C:
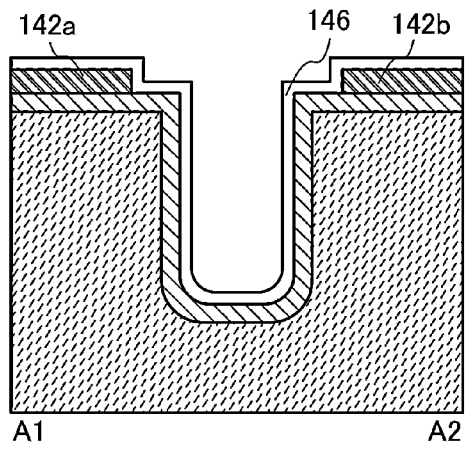

Next, the crystalline oxide semiconductor film 144 is formed so as to cover the trench 131 (see FIG. 2B). The crystalline oxide semiconductor film 144 is an oxide semiconductor film having a crystallized portion, for which a c-axis aligned crystalline oxide semiconductor (CAAC-OS) film is used. The crystalline oxide semiconductor film 144 includes a crystal having a c-axis substantially perpendicular to a surface of the crystalline oxide semiconductor film 144 at least over the lower end corner portion 300.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

Part of oxygen included in the CAAC-OS film may be substituted with nitrogen.

There are three methods for obtaining a crystalline oxide semiconductor having c-axis alignment. The first method is to form an oxide semiconductor film at a film formation temperature of 200° C. to 450° C., thereby obtaining c-axis alignment substantially perpendicular to a surface. The second method is to form a thin oxide semiconductor film and then subject the film to heat treatment performed at 200° C. to 700° C., thereby obtaining c-axis alignment substantially perpendicular to a surface. The third method is to form a first thin oxide semiconductor film, subject the film to heat treatment performed at 200° C. to 700° C., and then form a second oxide semiconductor film, thereby obtaining c-axis alignment substantially perpendicular to a surface.

In this embodiment, the crystalline oxide semiconductor film 144 having c-axis alignment substantially perpendicular to a surface is formed by film formation at a film formation temperature of 200° C. to 450° C.

With the use of the CAAC-OS film as the crystalline oxide semiconductor film 144, it is possible to provide a highly reliable semiconductor device in which changes of the electrical characteristics of a transistor due to irradiation with visible light or ultraviolet light can be suppressed.

The crystalline oxide semiconductor film 144 can have a thickness of 1 nm to 100 nm and can be formed by a sputtering method, a molecular beam epitaxy (MBE) method, a CVD method, a pulse laser deposition method, an atomic layer deposition (ALD) method, or the like as appropriate. The crystalline oxide semiconductor film 144 may be formed using a sputtering apparatus which performs film formation with surfaces of a plurality of substrates set substantially perpendicular to a surface of a sputtering target, which is so called a columnar plasma (CP) sputtering system. Through any of the methods, crystal growth occurs in the direction perpendicular to an uneven surface of the oxide semiconductor film, and a crystalline oxide semiconductor having c-axis alignment can be obtained.

As a material of the crystalline oxide semiconductor film 144, at least one element selected from In, Ga, Sn, and Zn is contained. For example, a four-component metal oxide such as an In—Sn—Ga—Zn—O-based oxide semiconductor, a three-component metal oxide such as an In—Ga—Zn—O-based oxide semiconductor, an In—Sn—Zn—O- based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, or a Hf—In—Zn—O-based oxide semiconductor, a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor, a single-component metal oxide such as an In—O-based oxide semiconductor, a Sn—O-based oxide semiconductor, or a Zn—O-based oxide semiconductor, or the like can be used. In addition, any of the above oxide semiconductors may contain an element other than In, Ga, Sn, and Zn, for example, $SiO_2$.

For example, an In—Ga—Zn—O-based oxide semiconductor means an oxide semiconductor containing indium (In), gallium (Ga), and zinc (Zn), and there is no particular limitation on the composition ratio thereof.

For the crystalline oxide semiconductor film 144, a thin film represented by the chemical formula, $InMO_3(ZnO)_m$ (m>0), can be used. Here, M represents one or more metal elements selected from Zn, Ga, Al, Mn, and Co. For example, M may be Ga, Ga and Al, Ga and Mn, Ga and Co, or the like.

In the case where an In—Sn—Zn—O-based oxide semiconductor material is used as an oxide semiconductor, a target therefor may have a composition ratio of In:Sn:Zn=1:2:2, In:Sn:Zn=2:1:3, or In:Sn:Zn=1:1:1 in atomic ratio, for example.

In the case where an In—Zn—O-based material is used as an oxide semiconductor, a target therefor has a composition ratio of In:Zn=50:1 to 1:2 in atomic ratio ($In_2O_3$:ZnO=25:1 to 1:4 in molar ratio), preferably, In:Zn=20:1 to 1:1 in atomic ratio ($In_2O_3$:ZnO=10:1 to 1:2 in molar ratio), further preferably, In:Zn=15:1 to 1.5:1 in atomic ratio ($In_2O_3$:ZnO=15:2 to 3:4 in molar ratio). For example, in a target used for formation of an In—Zn—O-based oxide semiconductor which has an atomic ratio of In:Zn:O=X:Y:Z, the relation of Z>1.5X+Y is satisfied.

Note that it is preferable that the crystalline oxide semiconductor film 144 be formed under a condition that much oxygen is contained during film formation (e.g., formed by a sputtering method in a 100% oxygen atmosphere), so that a film containing much oxygen (preferably including a region where the oxygen content is higher than that in the stoichiometric composition of the oxide semiconductor in a crystalline state) is formed.

Further, heat treatment may be performed on the crystalline oxide semiconductor film 144 in order to remove excess hydrogen (including water and a hydroxyl group) (to perform dehydration or dehydrogenation). The temperature of the heat treatment is higher than or equal to 300° C. and lower than or equal to 700° C., or lower than the strain point of the substrate. For example, the substrate is introduced into an electric furnace which is one of heat treatment apparatuses, and a heating step is performed on the oxide semiconductor film at 450° C. for 1 hour in a nitrogen atmosphere.

Note that a heat treatment apparatus is not limited to an electric furnace, and a device for heating an object to be processed by heat conduction or heat radiation from a heating element such as a resistance heating element may alternatively be used. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the high-temperature gas, an inert gas that does not react with an object to be processed by heat treatment, for example, nitrogen or a rare gas such as argon, is used.

For example, as the heating step, GRTA may be performed as follows. The substrate is put in an inert gas heated to high temperatures of 650° C. to 700° C., is heated for several minutes, and is taken out of the inert gas.

Note that the heat treatment for dehydration or dehydrogenation may be performed at any timing in the process of manufacturing the transistor 162 as long as it is performed between the formation of the crystalline oxide semiconductor film 144 and the formation of a film having a function to block impurities such as hydrogen and moisture (e.g., an aluminum oxide film) over the crystalline oxide semiconductor film 144.

Note that in the heat treatment, it is preferable that water, hydrogen, and the like be not contained in nitrogen or a rare gas such as helium, neon, or argon. Alternatively, the purity of nitrogen or a rare gas such as helium, neon, or argon introduced into a heat treatment apparatus is preferably set to 6N (99.9999%) or more, further preferably 7N (99.99999%) or more (i.e., the impurity concentration is 1 ppm or less, preferably 0.1 ppm or less).

In addition, after the crystalline oxide semiconductor film 144 is heated by the heat treatment, it is possible to introduce, into the same furnace, a high-purity oxygen gas, a high-purity $N_2O$ gas, or ultra-dry air (with a moisture content of 20 ppm (equivalent to a dew point of −55° C.) or less, preferably 1 ppm or less, further preferably 10 ppb or less, when measured with a dew point meter using cavity ring down laser spectroscopy (CRDS)). It is preferable that water, hydrogen, and the like be not contained in the oxygen gas or the $N_2O$ gas. The purity of the oxygen gas or the $N_2O$ gas that is introduced into the heat treatment apparatus is preferably greater than or equal to 6N, more preferably greater than or equal to 7N (i.e., the concentration of impurities in the oxygen gas or the $N_2O$ gas is preferably less than or equal to 1 ppm, further preferably less than or equal to 0.1 ppm). The oxygen gas or the $N_2O$ gas acts to supply oxygen that is a main component material of the crystalline oxide semiconductor and that is reduced by the step for removing an impurity for the dehydration or dehydrogenation, so that the crystalline oxide semiconductor film 144 can be a purified, electrically i-type (intrinsic) crystalline oxide semiconductor film.

Note that the crystalline oxide semiconductor film 144 may be processed into an island shape or may remain in the form of a film without being processed. In addition, an element isolation region formed using an insulating layer may be provided to isolate the crystalline oxide semiconductor film for each element. A trench structure can be employed for the element isolation region.

Note that in the case where the crystalline oxide semiconductor film 144 is processed into an island shape, etching of the crystalline oxide semiconductor film 144 may be dry etching, wet etching, or both dry etching and wet etching. As an etchant used for wet etching of the crystalline oxide semiconductor film 144, for example, a mixed solution of phosphoric acid, acetic acid, and nitric acid, or the like can be used. In addition, ITO-07N (produced by KANTO CHEMICAL CO., INC.) may be used.

Next, a conductive film used for forming a source electrode layer and a drain electrode layer (including a wiring formed using the same layer as the source electrode layer and the drain electrode layer) is formed over the crystalline oxide semiconductor film 144. The conductive film is formed using a material that can withstand heat treatment in a later step. As the conductive film used for forming the source electrode layer and the drain electrode layer, it is possible to use, for example, a metal film containing an element selected from Al, Cr, Cu, Ta, Ti, Mo, and W, a metal nitride film containing any of these elements as its component (a titanium nitride film, a molybdenum nitride film, or a tungsten nitride film), or the like. Alternatively, a film of a high-melting-point metal such as Ti, Mo, or W or a metal nitride film thereof (e.g., a titanium nitride film, a molybdenum nitride film, or a tungsten nitride film) may be formed over or/and below a metal film such as an Al film or a Cu film. Further alternatively, the conductive film used for forming the source electrode layer and the drain electrode layer may be formed using a conductive metal oxide. As the conductive metal oxide, indium oxide ($In_2O_3$), tin oxide ($SnO_2$), zinc oxide (ZnO), indium tin oxide ($In_2O_3$—$SnO_2$), indium zinc oxide ($In_2O_3$—ZnO), or any of these metal oxide materials containing silicon oxide can be used.

A resist mask is formed over the conductive film through a photolithography process, the electrode layer 142a and the electrode layer 142b serving as the source electrode layer and the drain electrode layer are formed by selective etching, and then, the resist mask is removed.

In this embodiment, since a Ti film is used as the conductive film and an In—Ga—Zn—O-based oxide semiconductor is used for the crystalline oxide semiconductor film 144, an ammonia hydrogen peroxide mixture (a mixture of ammonia, water, and hydrogen peroxide) is used as an etchant.

Then, the gate insulating layer 146 is formed so as to cover part of the crystalline oxide semiconductor film 144 and the electrode layers 142a and 142b functioning as a source electrode and a drain electrode. The gate insulating layer 146 is also formed on the inner wall and the bottom of the trench in the channel-width direction (see FIG. 2C).

The gate insulating layer 146 can have a thickness of 1 nm to 100 nm and can be formed by a sputtering method, an MBE method, a CVD method, a pulse laser deposition method, an ALD method, or the like as appropriate. The gate insulating layer 146 may be formed using a sputtering apparatus which performs film formation with surfaces of a plurality of substrates set substantially perpendicular to a surface of a sputtering target, which is so called a columnar plasma (CP) sputtering system.

The gate insulating layer 146 can be formed using a silicon oxide film, a gallium oxide film, an aluminum oxide film, a silicon nitride film, a silicon oxynitride film, an aluminum oxynitride film, or a silicon nitride oxide film. A portion of the gate insulating layer 146 which is in contact with the crystalline oxide semiconductor film 144 preferably contains oxygen. In particular, an oxide insulating film preferably contains a large amount of oxygen which exceeds at least the stoichiometry in (a bulk of) the film. For example, in the case where a silicon oxide film is used as the gate insulating layer 146, the composition formula is $SiO_{2+\alpha}$ ($\alpha>0$). In this embodiment, a silicon oxide film of $SiO_{2+\alpha}$ ($\alpha>0$) is used as the gate insulating layer 146. By using the silicon oxide film as the gate insulating layer 146, oxygen can be supplied to the crystalline oxide semiconductor film 144 and favorable characteristics can be obtained. Further, the gate insulating layer 146 is preferably formed in consideration of the size of a transistor to be formed and the step coverage with the gate insulating layer 146.

When the gate insulating layer 146 is formed using a high-k material such as hafnium oxide, yttrium oxide, hafnium silicate ($HfSi_xO_y$ (x>0, y>0)), hafnium silicate to which nitrogen is added, hafnium aluminate ($HfAl_xO_y$ (x>0, y>0)), or lanthanum oxide, gate leakage current can be reduced. Further, the gate insulating layer 146 may have a single-layer structure or a stacked structure.

Figure 2D:
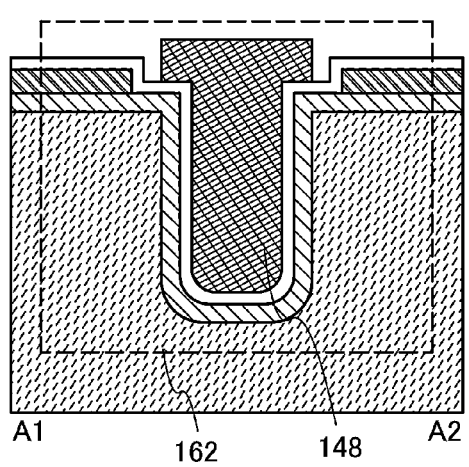

Then, the gate electrode layer 148 is formed over the gate insulating layer 146 so that a conductive material used for the gate electrode layer fills the trench (see FIG. 2D). The gate electrode layer 148 can be formed using a metal material such as molybdenum, titanium, tantalum, tungsten, aluminum, copper, chromium, neodymium, or scandium or an alloy material which contains any of these materials as its main component. Alternatively, a semiconductor film typified by a polycrystalline silicon film doped with an impurity element such as phosphorus, or a silicide film such as a nickel silicide film may be used as the gate electrode layer 148. The gate electrode layer 148 may have a single-layer structure or a stacked structure.

The gate electrode layer 148 can also be formed using a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible that the gate electrode layer 148 has a stacked structure of the above conductive material and the above metal material.

As one layer of the gate electrode layer 148 which is in contact with the gate insulating layer 146, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (InN, SnN, or the like) film can be used. These films each have a work function of 5 eV or higher, preferably 5.5 eV or higher, which enables the threshold voltage of the transistor to be positive when used as the gate electrode layer. Accordingly, a so-called normally off switching element can be provided.

When the gate electrode layer 148 is formed in the trench, the transistor 162 with a trench structure is formed.

From the purified crystalline oxide semiconductor film 144, impurities such as hydrogen and water have been removed sufficiently, and the concentration of hydrogen in the crystalline oxide semiconductor film 144 is $5\times10^{19}$ atoms/$cm^3$ or less, preferably $5\times10^{18}$ atoms/$cm^3$ or less. Note that the concentration of hydrogen in the crystalline oxide semiconductor film 144 is measured by secondary ion mass spectrometry (SIMS).

The number of carriers in the purified crystalline oxide semiconductor film 144 is very small (close to zero), and the carrier concentration is lower than $1\times10^{14}/cm^3$, preferably lower than $1\times10^{12}/cm^3$, more preferably lower than $1\times10^{11}/cm^3$.

Although not illustrated, an insulating layer may be provided over the transistor 162 with a trench structure.

As the insulating layer, a single layer or a stack of one or more inorganic insulating films, typical examples of which are a silicon oxide film, a silicon oxynitride film, an aluminum oxide film, an aluminum oxynitride film, a hafnium oxide film, a gallium oxide film, a silicon nitride film, an aluminum nitride film, a silicon nitride oxide film, and an aluminum nitride oxide film, can be used.

An insulating layer may be additionally stacked over the insulating layer. Particularly in the case where an oxide insulating layer is used as the insulating layer, it is preferable to form a protective insulating layer, over the insulating layer, for blocking entry of impurities such as moisture and hydrogen into the crystalline oxide semiconductor film 144. For the protective insulating layer, an inorganic insulating film, examples of which are a silicon nitride film, an aluminum oxide film, a silicon nitride oxide film, an aluminum nitride film, and an aluminum nitride oxide film, may be used. For example, an aluminum oxide film having a high shielding effect (blocking effect), which is not permeable to either oxygen or impurities such as hydrogen and moisture, can be used.

A heating step may be additionally performed after the insulating layer is formed. For example, a heating step may be performed at a temperature higher than or equal to 100° C. and lower than or equal to 200° C. in the air for longer than or equal to 1 hour and shorter than or equal to 30 hours. This heating step may be performed at a fixed heating temperature. Alternatively, the following change in the heating temperature may be conducted plural times repeatedly: the heating temperature is increased from room temperature to a temperature higher than or equal to 100° C. and lower than or equal to 200° C. and then decreased to room temperature.

In addition, a planarization insulating film may be formed in order to reduce surface unevenness due to the transistor 162. As the planarization insulating film, an organic material such as a polyimide-based resin, an acrylic-based resin, or a benzocyclobutene-based resin can be used. Other than such organic materials, it is also possible to use a low dielectric constant material (low-k material) or the like. Note that the planarization insulating film may be formed by stacking a plurality of insulating films formed using any of these materials.

Figure 4A:
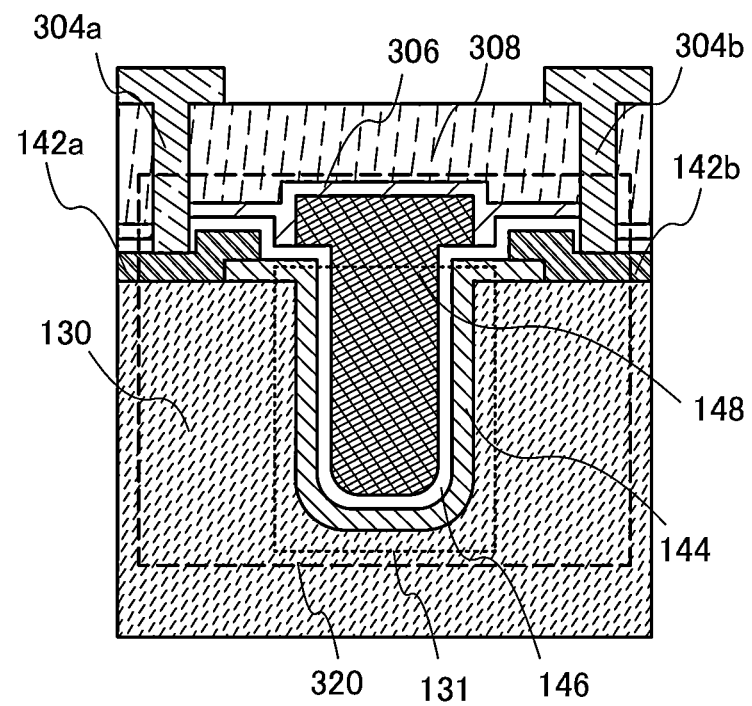
FIGS. 4A and 4B illustrate an embodiment of a semiconductor device.
Figure 4B:
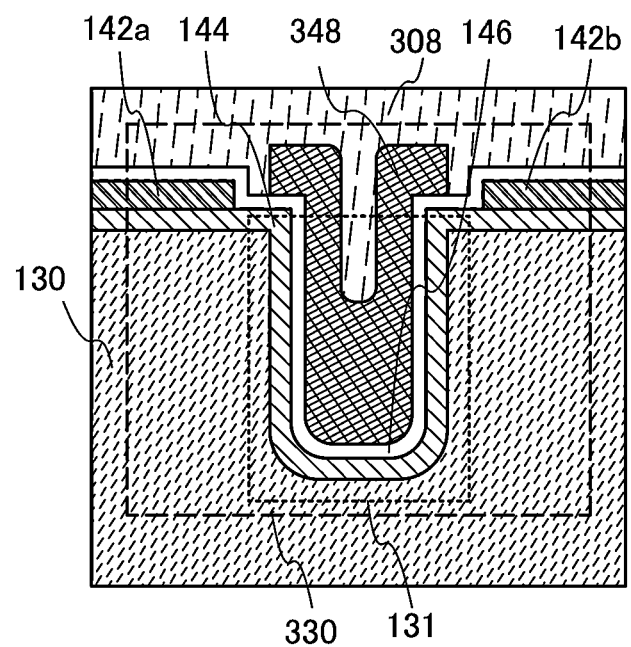

Examples in which an insulating layer is provided over a transistor are illustrated in FIGS. 4A and 4B.

FIG. 4A illustrates an example in which an insulating layer 306 is formed so as to cover a gate electrode layer 148 of a transistor 320 and a planarization insulating film 308 is also formed over the insulating layer 306. In addition, openings reaching an electrode layer 142a and an electrode layer 142b are formed in a gate insulating layer 146, the insulating layer 306, and the planarization insulating film 308, and a wiring layer 304a electrically connected to the electrode layer 142a and a wiring layer 304b electrically connected to the electrode layer 142b are formed in the openings.

FIG. 4B illustrates an example in which a planarization insulating film 308 is formed so as to fill a depressed portion of a gate electrode layer 348 formed in a trench in a transistor 330.

In the transistor 162 formed using the purified crystalline oxide semiconductor film 144 in this embodiment, a value of a current in an off state (a value of an off-state current, here, current per unit channel width (1 μm) at room temperature (25° C.)) can be reduced so as to be less than or equal to 100 zA/μm (1 zA (zetopampere) is $1\times10^{-21}$ A), preferably less than or equal to 10 zA/μm, more preferably less than or equal to 1 zA/μm, further preferably equal to or less than 100 yA/μm at room temperature.

In the transistor 162, the crystalline oxide semiconductor film 144 is provided along the trench 131 formed in the insulating layer 130 and including the lower end corner portion 300 having a curved shape with a curvature radius of longer than or equal to 20 nm and shorter than or equal to 60 nm (preferably, longer than or equal to 20 nm and shorter than or equal to 30 nm). The channel length of the crystalline oxide semiconductor film 144 can be controlled by appropriately setting the depth of the trench 131 even when the distance between the electrode layer 142a and the electrode layer 142b is decreased; thus, the occurrence of a short-channel effect due to miniaturization can be suppressed.

In addition, the crystalline oxide semiconductor film 144 includes a crystal having a c-axis substantially perpendicular to a surface at least over the lower end corner portion 300. With such a crystalline oxide semiconductor film, it is possible to provide a highly reliable semiconductor device in which changes of the electrical characteristics of a transistor due to irradiation with visible light or ultraviolet light can be suppressed.

A channel of the transistor 162 is formed along the inner wall of the trench, and carriers smoothly flow through In—O—In—O in the crystalline oxide semiconductor (CAAC-OS) film 144 even when its channel formation region is not flat. In this embodiment, since the crystalline oxide semiconductor film 144 of the transistor 162 is formed in contact with the inner wall and the bottom of the trench, the channel length is the sum of twice the length of the side surface (inner wall) of the trench (the depth d of the trench in FIG. 1B) and the length of the bottom of the trench (the length L in FIG. 1B) and can be longer than the length of the bottom of the trench (the length L in FIG. 1B). A transistor with such a channel length can be a normally off transistor, and the occurrence of short-channel effect can be prevented. In addition, by employing the trench structure, a reduction in the planar area of a transistor can be achieved, so that miniaturization and higher integration can be achieved.

In the above manner, it is possible to provide stable electrical characteristics and high reliability to a miniaturized and integrated semiconductor device including an oxide semiconductor.

(Embodiment 2)

In this embodiment, another embodiment of a method for manufacturing a semiconductor device will be described with reference to FIGS. 3A to 3D. The same portions as those in the above embodiment or the portions having functions similar to those in the above embodiment can be formed in manners similar to those of the above embodiment. The same steps as those in the above embodiment and steps similar to those in the above embodiment can be conducted in manners similar to those of the above embodiment. Therefore, the descriptions thereof are not repeated in this embodiment. In addition, detailed description of the same portions is omitted.

In this embodiment, an example of a method for manufacturing a semiconductor device according to the disclosed invention is described, in which an amorphous oxide semiconductor film is at least partially crystallized through heat treatment so that a crystalline oxide semiconductor film is formed which includes a crystal having a c-axis substantially perpendicular to a surface of the crystalline oxide semiconductor film.

FIGS. 3A to 3D illustrate an example of a method for manufacturing a transistor 162 of this embodiment.

First, an insulating layer is formed using an oxide film over a substrate. Then, a plurality of trenches 131 (also referred to as grooves) is formed in the insulating layer to form an insulating layer 130 provided with the trenches 131. The lower end corner portion 300 of the trench 131 has a curved shape with a curvature radius of longer than or equal to 20 nm and shorter than or equal to 60 nm (preferably, longer than or equal to 20 nm and shorter than or equal to 30 nm).

Figure 3A:
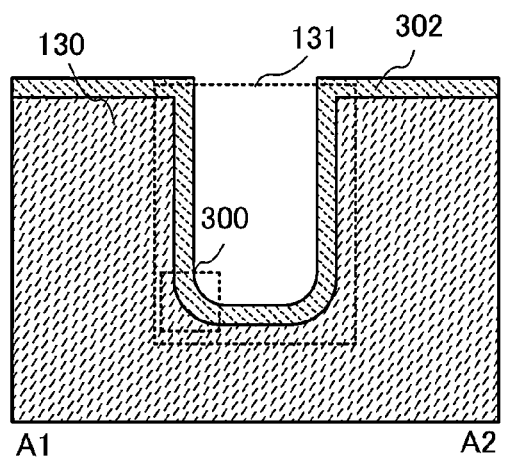
FIGS. 3A to 3D illustrate an embodiment of a method for manufacturing a semiconductor device.

Next, an amorphous oxide semiconductor film 302 is formed so as to cover the trench 131 (see FIG. 3A). The amorphous oxide semiconductor film 302 can be formed using a material and a manufacturing method similar to those for the crystalline oxide semiconductor film 144 described in Embodiment 1; the substrate temperature is set to a temperature at which crystallization does not occur during film formation (preferably lower than or equal to 200° C.).

Further, heat treatment may be performed in order to remove excess hydrogen (including water and a hydroxyl group) from the amorphous oxide semiconductor film 302 (to perform dehydration or dehydrogenation). The heat treatment is performed at a temperature at which the amorphous oxide semiconductor film is not crystallized, typically, higher than or equal to 250° C. and lower than or equal to 400° C., preferably lower than or equal to 300° C.

The heat treatment for dehydration or dehydrogenation is preferably performed before the amorphous oxide semiconductor film 302 is processed into an island shape because oxygen contained in the insulating layer 130 can be prevented from being released by the heat treatment.

Note that in the heat treatment, it is preferable that water, hydrogen, and the like be not contained in nitrogen or a rare gas such as helium, neon, or argon. Alternatively, the purity of nitrogen or a rare gas such as helium, neon, or argon introduced into a heat treatment apparatus is preferably set to 6N (99.9999%) or more, further preferably 7N (99.99999%) or more (i.e., the impurity concentration is 1 ppm or less, preferably 0.1 ppm or less).

In addition, after the amorphous oxide semiconductor film 302 is heated by the heat treatment, it is possible to introduce, into the same furnace, a high-purity oxygen gas, a high-purity $N_2O$ gas, or ultra-dry air (with a moisture content of 20 ppm (equivalent to a dew point of −55° C.) or less, preferably 1 ppm or less, further preferably 10 ppb or less, when measured with a dew point meter using cavity ring down laser spectroscopy (CRDS)). It is preferable that water, hydrogen, and the like be not contained in the oxygen gas or the $N_2O$ gas. The purity of the oxygen gas or the $N_2O$ gas that is introduced into the heat treatment apparatus is preferably greater than or equal to 6N, more preferably greater than or equal to 7N (i.e., the concentration of impurities in the oxygen gas or the $N_2O$ gas is preferably less than or equal to 1 ppm, more preferably less than or equal to 0.1 ppm). The oxygen gas or the $N_2O$ gas acts to supply oxygen that is a main component material of the amorphous oxide semiconductor and that is reduced by the step for removing an impurity for the dehydration or dehydrogenation, so that the amorphous oxide semiconductor film can be a purified, electrically i-type (intrinsic) amorphous oxide semiconductor film.

Figure 3B:
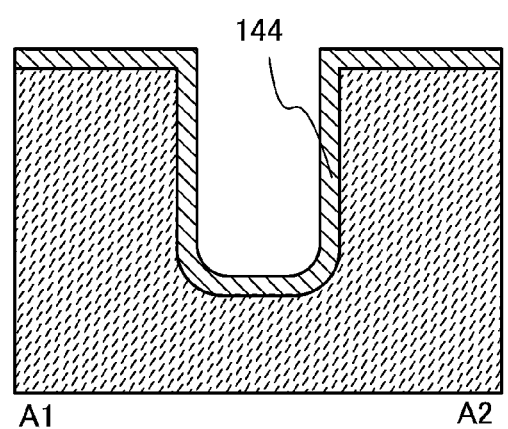
Figure 3C:
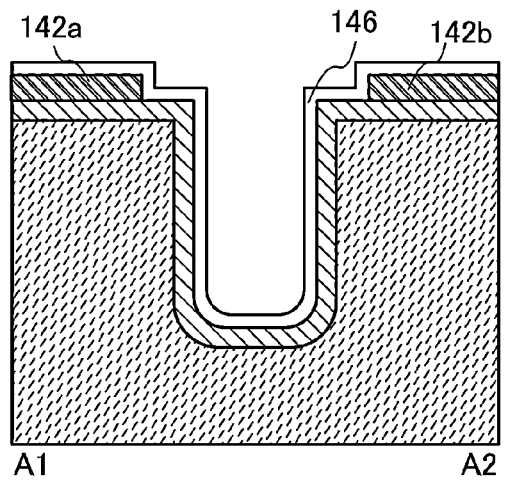

Next, the amorphous oxide semiconductor film 302 is at least partially crystallized through heat treatment so that a crystalline oxide semiconductor film 144 is formed which includes a crystal having a c-axis substantially perpendicular to a surface of the crystalline oxide semiconductor film 144 (see FIG. 3B).

The heat treatment for at least partially crystallizing the amorphous oxide semiconductor film 302 is performed at temperatures higher than or equal to 250° C. and lower than or equal to 700° C., preferably higher than or equal to 400° C., more preferably higher than or equal to 500° C., even more preferably higher than or equal to 550° C.

For example, the substrate is introduced into an electric furnace which is one of heat treatment apparatuses, and heat treatment is performed on the amorphous oxide semiconductor film 302 at 450° C. for 1 hour under reduced pressure.

Note that a heat treatment apparatus is not limited to an electric furnace, and a device for heating an object to be processed by heat conduction or heat radiation from a heating element such as a resistance heating element may alternatively be used. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the high-temperature gas, an inert gas that does not react with an object to be processed by heat treatment, for example, nitrogen or a rare gas such as argon is used.

For example, as the heat treatment, GRTA may be performed as follows. The substrate is put in an inert gas heated to high temperatures of 650° C. to 700° C., is heated for several minutes, and is taken out of the inert gas.

The heat treatment may be performed in an atmosphere of nitrogen, oxygen, ultra-dry air (air with a water content of 20 ppm or lower, preferably 1 ppm or lower, more preferably 10 ppb or lower), or a rare gas (argon, helium, or the like). Note that it is preferable that water, hydrogen, and the like be not contained in the atmosphere of nitrogen, oxygen, ultra-dry air, or a rare gas. The purity of nitrogen, oxygen, or a rare gas introduced into a heat treatment apparatus is preferably set to 6N (99.9999%) or more, further preferably 7N (99.99999%) or more (i.e., the impurity concentration is 1 ppm or less, preferably 0.1 ppm or less).

Then, electrode layers 142a and 142b functioning as a source electrode and a drain electrode are formed, and after that, a gate insulating layer 146 is formed so as to cover part of the crystalline oxide semiconductor film 144 and the electrode layers 142a and 142b. The gate insulating layer 146 is also formed on the inner wall and the bottom of the trench in the channel-width direction (see FIG. 3C).

Figure 3D:
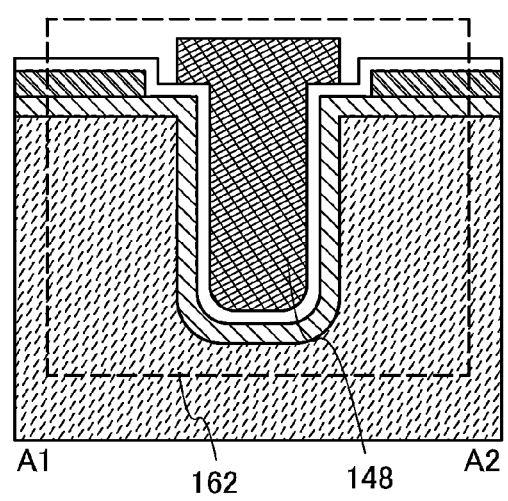

Then, a gate electrode layer 148 is formed over the gate insulating layer 146 so that a conductive material used for the gate electrode layer fills the trench (see FIG. 3D).

When the gate electrode layer 148 is formed in the trench, the transistor 162 with a trench structure is formed.

In the transistor 162, the crystalline oxide semiconductor film 144 is provided along the trench 131 formed in the insulating layer 130 and including the lower end corner portion 300 having a curved shape with a curvature radius of longer than or equal to 20 nm and shorter than or equal to 60 nm (preferably, longer than or equal to 20 nm and shorter than or equal to 30 nm). The channel length of the crystalline oxide semiconductor film 144 can be controlled by appropriately setting the depth of the trench 131 even when the distance between the electrode layer 142a and the electrode layer 142b is decreased; thus, the occurrence of a short-channel effect due to miniaturization can be suppressed.

In addition, the crystalline oxide semiconductor film 144 includes a crystal having a c-axis substantially perpendicular to a surface at least over the lower end corner portion 300. With such a crystalline oxide semiconductor film, it is possible to provide a highly reliable semiconductor device in which changes of the electrical characteristics of a transistor due to irradiation with visible light or ultraviolet light can be suppressed.

A channel of the transistor 162 is formed along the inner wall of the trench 131, and carriers smoothly flow through In—O—In—O in the crystalline oxide semiconductor film 144 (CAAC-OS film) even when its channel formation region is not flat. In this embodiment, since the crystalline oxide semiconductor film 144 of the transistor 162 is formed in contact with the inner wall and the bottom of the trench 131, the channel length is the sum of twice the length of the side surface (inner wall) of the trench (the depth d of the trench in FIG. 1B) and the length of the bottom of the trench (the length L in FIG. 1B) and can be longer than the length of the bottom of the trench (the length L in FIG. 1B). A transistor with such a channel can be a normally off transistor, and the occurrence of short-channel effect can be prevented. In addition, by employing the trench structure, a reduction in the planar area of a transistor can be achieved, so that miniaturization and integration can be achieved.

In the above manner, it is possible to provide stable electrical characteristics and high reliability to a miniaturized and integrated semiconductor device including an oxide semiconductor.

This embodiment can be implemented in appropriate combinations with any of the other embodiments.

(Embodiment 3)

In this embodiment, an example of a semiconductor device which includes the transistor 162 described in Embodiment 1 or 2, which can hold stored data even when not powered, and which has an unlimited number of write cycles will be described with reference to drawings. Note that the transistor 320 or the transistor 330 described in Embodiments 1 or 2 can also be used in the semiconductor device of this embodiment.

Since the off-state current of the transistor 162 is small, stored data can be held for a long time owing to such a transistor. In other words, it is possible to obtain a semiconductor memory device which does not require refresh operation or has an extremely low frequency of the refresh operation, which leads to a sufficient reduction in power consumption.

Figure 5A:
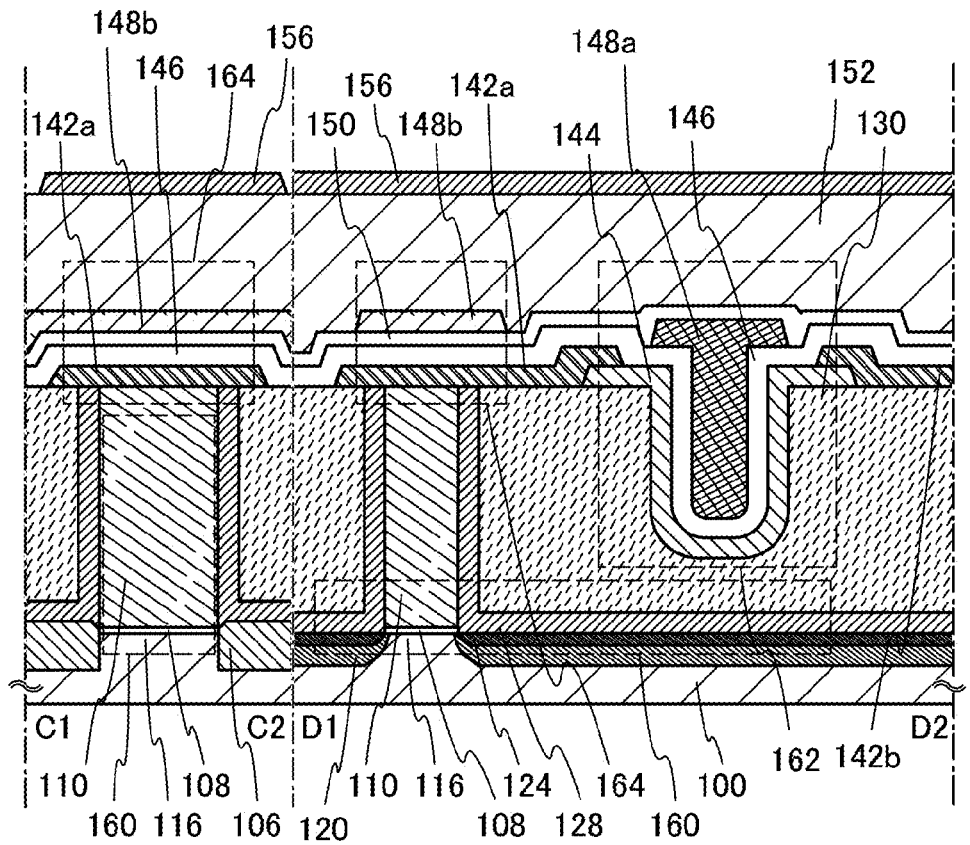
FIGS. 5A to 5C are a cross-sectional view, a plan view, and a circuit diagram illustrating a semiconductor device in an embodiment of the present invention.
Figure 5B:
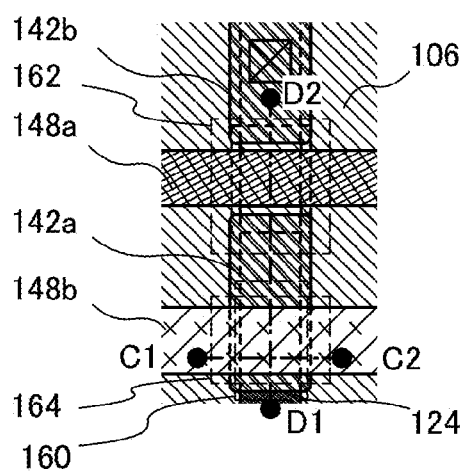
Figure 5C:
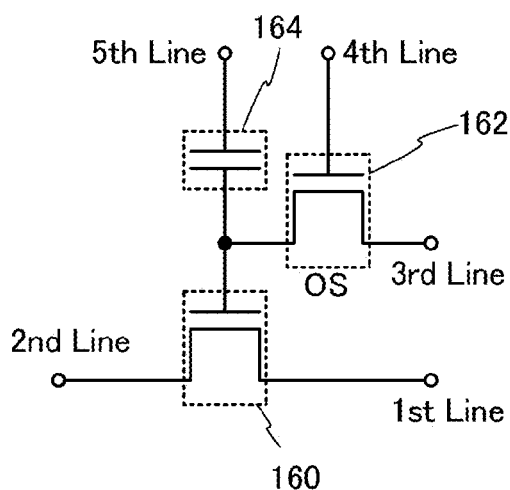

FIGS. 5A to 5C illustrate an example of a configuration of the semiconductor device. FIG. 5A is a cross-sectional view of the semiconductor device, FIG. 5B is a plan view of the semiconductor device, and FIG. 5C is a circuit diagram of the semiconductor device. Here, FIG. 5A corresponds to a cross section along line C1-C2 and line D1-D2 in FIG. 5B.

The semiconductor device illustrated in FIGS. 5A and 5B includes a transistor 160 including a first semiconductor material in a lower portion, and a transistor 162 including a second semiconductor material in an upper portion. The transistor 162 has the same structure as that described in Embodiment 1 or 2; thus, for description of FIGS. 5A and 5B, the same reference numerals are used for the same parts as those in FIGS. 1A and 1B.

Here, the first semiconductor material and the second semiconductor material are preferably materials having different band gaps. For example, the first semiconductor material can be a semiconductor material (such as silicon) other than an oxide semiconductor, and the second semiconductor material can be an oxide semiconductor. A transistor including a material other than an oxide semiconductor can operate at high speed easily. On the other hand, a transistor including oxide semiconductor can hold stored data for a long time owing to its characteristics.

Although both of the above transistors are n-channel transistors in the following description, it is needless to say that p-channel transistors can be used. The technical nature of the disclosed invention is to use a crystalline oxide semiconductor (CAAC-OS) in the transistor 162 so that data can be held. Therefore, it is not necessary to limit a specific structure of the semiconductor device, such as a material of the semiconductor device or a structure of the semiconductor device, to the structure described here.

The transistor 160 in FIG. 5A includes a channel formation region 116 provided in a substrate 100 including a semiconductor material (such as silicon), impurity regions 120 provided such that the channel formation region 116 is sandwiched therebetween, metal compound regions 124 provided in contact with the impurity regions 120, a gate insulating layer 108 provided over the channel formation region 116, and a gate electrode 110 provided over the gate insulating layer 108. Note that a transistor whose source electrode and drain electrode are not illustrated in a drawing may also be referred to as a transistor for the sake of convenience. Further, in such a case, in description of a connection of a transistor, a source region and a source electrode layer may be collectively referred to as a source electrode layer, and a drain region and a drain electrode layer may be collectively referred to as a drain electrode layer. That is, in this specification, the term "source electrode" or "source electrode layer" may include a source region.

Further, an element isolation insulating layer 106 is formed on the substrate 100 so as to surround the transistor 160, and an insulating layer 128 and an insulating layer 130 are formed so as to cover the transistor 160. Note that for higher integration, it is preferable that, as in FIG. 5A, the transistor 160 does not have a sidewall insulating layer. On the other hand, when the characteristics of the transistor 160 have priority, the sidewall insulating layer may be formed on a side surface of the gate electrode 110 and the impurity regions 120 may include a region having a different impurity concentration.

As illustrated in FIG. 5A, the transistor 162 includes the crystalline oxide semiconductor film 144 with a crystalline oxide semiconductor (CAAC-OS) and has a trench structure. Here, the crystalline oxide semiconductor film 144 is preferably a purified crystalline oxide semiconductor film. By using a purified oxide semiconductor, the transistor 162 which has extremely favorable off-state characteristics can be obtained.

An insulating layer 150 having a single-layer structure or a stacked-layer structure is provided over the transistor 162. In addition, a conductive layer 148b is provided in a region overlapping with the electrode layer 142a of the transistor 162 with the insulating layer 150 interposed therebetween, and the electrode layer 142a, the insulating layer 150, and the conductive layer 148b form a capacitor 164. That is, the electrode layer 142a of the transistor 162 functions as one electrode of the capacitor 164, and the conductive layer 148b functions as the other electrode of the capacitor 164. Note that in the case where no capacitor is needed, a structure in which the capacitor 164 is not provided is also possible. Alternatively, the capacitor 164 may be separately provided above the transistor 162. For example, a trench-type capacitor or a stack-type capacitor may be separately formed above the transistor 162 or below the transistor 160 so as to be three-dimensionally stacked, whereby the degree of integration may be increased.

An insulating layer 152 is provided over the transistor 162 and the capacitor 164. In addition, a wiring 156 for connecting the transistor 162 to another transistor is provided over the insulating layer 152. Although not illustrated in FIG. 5A, the wiring 156 is electrically connected to the electrode layer 142b through an electrode formed in an opening provided in the insulating layer 150, the insulating layer 152, and the like. Here, the electrode is preferably provided so as to partly overlap with at least the crystalline oxide semiconductor film 144 of the transistor 162.

Note that the electrical connection between the electrode layer 142b and the wiring 156 may be established by direct contact of the electrode layer 142b and the wiring 156 with each other or through an electrode provided in an insulating layer lying therebetween as described in this embodiment. Alternatively, the electrical connection may be established through a plurality of electrodes.

In FIGS. 5A and 5B, the transistors 160 and 162 are provided so as to at least partly overlap each other, and the source region or the drain region of the transistor 160 is preferably provided to partly overlap with the crystalline oxide semiconductor film 144. In addition, the transistor 162 and the capacitor 164 are provided so as to overlap with at least part of the transistor 160. For example, the conductive layer 148b of the capacitor 164 is provided to at least partly overlap with the gate electrode 110 of the transistor 160. When such a planar layout is employed, the area occupied by the semiconductor device can be reduced; thus, the degree of integration can be increased.

Next, an example of a circuit configuration corresponding to FIGS. 5A and 5B is illustrated in FIG. 5C.

In FIG. 5C, a first wiring (1st Line) is electrically connected to a source electrode of the transistor 160. A second wiring (2nd Line) is electrically connected to a drain electrode of the transistor 160. A third wiring (3rd Line) is electrically connected to one of a source and a drain electrodes of the transistor 162, and a fourth wiring (4th Line) is electrically connected to a gate electrode of the transistor 162. A gate electrode of the transistor 160 and the other of the source and drain electrodes of the transistor 162 are electrically connected to one electrode of the capacitor 164. A fifth wiring (5th Line) is electrically connected to the other electrode of the capacitor 164.

The semiconductor device in FIG. 5C utilizes a characteristic in which the potential of the gate electrode of the transistor 160 can be held, and thus enables data writing, holding, and reading as follows.

Writing and holding of data will be described. First, the potential of the fourth wiring is set to a potential at which the transistor 162 is turned on, so that the transistor 162 is turned on. Accordingly, the potential of the third wiring is supplied to the gate electrode of the transistor 160 and to the capacitor 164. That is, predetermined charge is supplied to the gate electrode of the transistor 160 (writing). Here, one of two kinds of charges providing different potential levels (hereinafter referred to as a low-level charge and a high-level charge) is applied. After that, the potential of the fourth wiring is set to a potential at which the transistor 162 is turned off, so that the transistor 162 is turned off. Thus, the charge supplied to the gate electrode of the transistor 160 is held (holding).

Since the off-state current of the transistor 162 is significantly small, the charge of the gate electrode of the transistor 160 is held for a long time.

Next, reading of data will be described. By supplying an appropriate potential (a reading potential) to the fifth wiring while supplying a predetermined potential (a constant potential) to the first wiring, the potential of the second wiring varies depending on the amount of charge held at the gate electrode of the transistor 160. This is because in general, when the transistor 160 is an n-channel transistor, an apparent threshold voltage $V_{th\_H}$ in the case where the high-level charge is given to the gate electrode of the transistor 160 is lower than an apparent threshold voltage $V_{th\_L}$ in the case where the low-level charge is given to the gate electrode of the transistor 160. Here, an apparent threshold voltage refers to the potential of the fifth wiring which is needed to turn on the transistor 160. Thus, the potential of the fifth wiring is set to a potential $V_0$ which is between $V_{th\_H}$ and $V_{th\_L}$, whereby charge supplied to the gate electrode of the transistor 160 can be determined. For example, in the case where the high-level charge is supplied in writing, when the potential of the fifth wiring is $V_0$ ($>V_{th\_H}$), the transistor 160 is turned on. In the case where the low-level charge is supplied in writing, even when the potential of the fifth wiring is $V_0$ ($<V_{th\_L}$), the transistor 160 remains off. Therefore, the data held can be read by measuring the potential of the second wiring.

Note that in the case where memory cells are arrayed, it is necessary that data of only a desired memory cell can be read. In that case, the fifth wirings of memory cells from which data is not read may be supplied with a potential at which the transistor 160 is turned off regardless of the state of the gate electrode, that is, a potential lower than $V_{th\_H}$. Alternatively, the fifth wirings may be supplied with a potential at which the transistor 160 is turned on regardless of the state of the gate electrode, that is, a potential higher than $V_{th\_L}$.

When including a transistor having a channel formation region formed using a crystalline oxide semiconductor (CAAC-OS) and having extremely small off-state current, the semiconductor device described in this embodiment can store data for an extremely long period. In other words, refresh operation becomes unnecessary or the frequency of the refresh operation can be extremely lowered, which leads to a sufficient reduction in power consumption. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional nonvolatile memory, it is not necessary to inject and extract electrons into and from a floating gate, and thus a problem such as deterioration of a gate insulating layer does not arise at all. That is, the semiconductor device according to the disclosed invention does not have a limitation on the number of times data can be rewritten, which is a problem of a conventional nonvolatile memory, and the reliability thereof is drastically improved. Furthermore, since data is written by turning on or off the transistors, high-speed operation can be easily realized.

In addition, by employing the trench structure for the transistor 162, a reduction in the planar area of the transistor 162 can be achieved, so that higher integration can be achieved.

The configuration, method, and the like described in this embodiment can be combined as appropriate with any of the configurations, methods, and the like described in the other embodiments.

(Embodiment 4)

In this embodiment, a semiconductor device which includes the transistor 162 described in Embodiment 1 or 2, which can hold stored data even when not powered, which has an unlimited number of write cycles, and which has a structure different from the structure described in Embodiment 3 will be described with reference to FIGS. 6A and 6B and FIGS. 7A and 7B. Note that the transistor 320 or the transistor 330 described in Embodiments 1 or 2 can also be used in the semiconductor device of this embodiment.

Figure 6A:
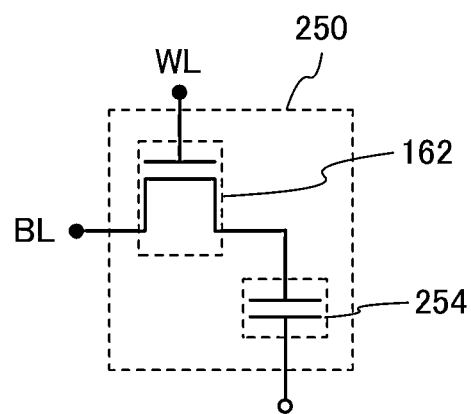
FIGS. 6A and 6B are a circuit diagram and a perspective view illustrating a semiconductor device in an embodiment of the present invention.
Figure 6B:
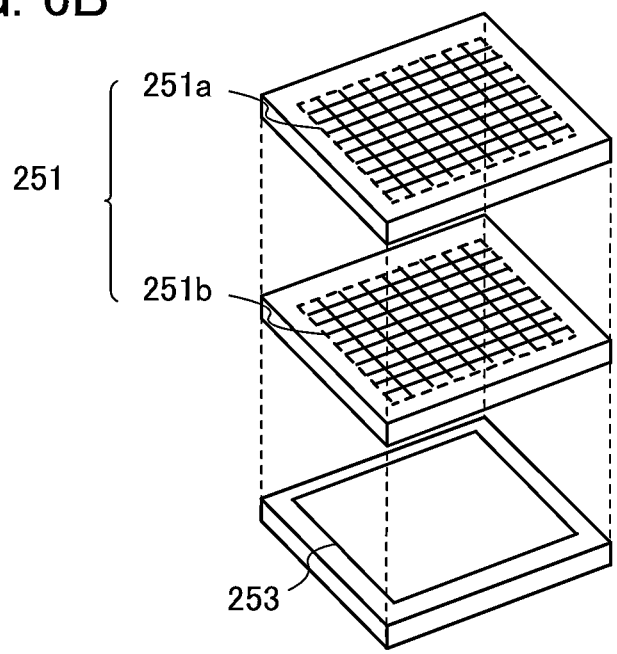

FIG. 6A illustrates an example of a circuit configuration of a semiconductor device, and FIG. 6B is a conceptual diagram illustrating an example of a semiconductor device. First, the semiconductor device illustrated in FIG. 6A will be described, and then, the semiconductor device illustrated in FIG. 6B will be described.

In the semiconductor device illustrated in FIG. 6A, a bit line BL is electrically connected to the source electrode or the drain electrode of the transistor 162, a word line WL is electrically connected to the gate electrode of the transistor 162, and the source electrode or the drain electrode of the transistor 162 is electrically connected to a first terminal of a capacitor 254.

The transistor 162 including a crystalline oxide semiconductor (CAAC-OS) has a characteristic of a significantly small off-state current. For that reason, a potential of the first terminal of the capacitor 254 (or a charge accumulated in the capacitor 254) can be held for an extremely long period by turning off the transistor 162. Further, in the transistor 162 including a crystalline oxide semiconductor (CAAC-OS), a short-channel effect is not likely to be caused, which is advantageous.

Next, writing and holding of data in the semiconductor device (a memory cell 250) illustrated in FIG. 6A will be described.

First, the potential of the word line WL is set to a potential at which the transistor 162 is turned on, so that the transistor 162 is turned on. Accordingly, the potential of the bit line BL is supplied to the first terminal of the capacitor 254 (writing). After that, the potential of the word line WL is set to a potential at which the transistor 162 is turned off, so that the transistor 162 is turned off. Thus, the charge at the first terminal of the capacitor 254 is held (holding).

Since the off-state current of the transistor 162 is extremely small, the potential of the first terminal of the capacitor 254 (or the charge accumulated in the capacitor) can be held for a long time.

Next, reading of data will be described. When the transistor 162 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL after charge redistribution is $(C_B \times V_{B0} + C \times V)/(C_B + C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL before the charge redistribution. Therefore, it can be found that assuming that the memory cell 250 is in either of two states in which the potentials of the first terminal of the capacitor 254 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=(C_B \times V_{B0} + C \times V_0)/(C_B + C)$).

Then, by comparing the potential of the bit line BL with a predetermined potential, data can be read.

As described above, the semiconductor device illustrated in FIG. 6A can hold charge that is accumulated in the capacitor 254 for a long time because the off-state current of the transistor 162 is extremely small. In other words, refresh operation becomes unnecessary or the frequency of the refresh operation can be extremely lowered, which leads to a sufficient reduction in power consumption. Moreover, stored data can be held for a long period even when power is not supplied.

Next, the semiconductor device illustrated in FIG. 6B will be described.

The semiconductor device illustrated in FIG. 6B includes a memory cell array 251 (memory cell arrays 251a and 251b) including a plurality of memory cells 250 illustrated in FIG. 6A as memory circuits in the upper portion, and a peripheral circuit 253 in the lower portion which is necessary for operating the memory cell array 251 (the memory cell arrays 251a and 251b). Note that the peripheral circuit 253 is electrically connected to the memory cell array 251.

In the structure illustrated in FIG. 6B, the peripheral circuit 253 can be provided under the memory cell array 251 (the memory cell arrays 251a and 251b). Thus, the size of the semiconductor device can be decreased.

A transistor provided in the peripheral circuit 253 is preferably formed using a semiconductor material which is different from that of the transistor 162. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, the transistor can favorably realize a variety of circuits (e.g., a logic circuit or a driver circuit) which needs to operate at high speed.

Note that FIG. 6B illustrates, as an example, the semiconductor device in which two memory cell arrays (the memory cell array 251a and the memory cell array 251b) are stacked; however, the number of memory cell arrays to be stacked is not limited thereto. Three or more memory cell arrays may be stacked.

Next, a specific structure of the memory cell 250 illustrated in FIG. 6A will be described with reference to FIGS. 7A and 7B.

Figure 7A:
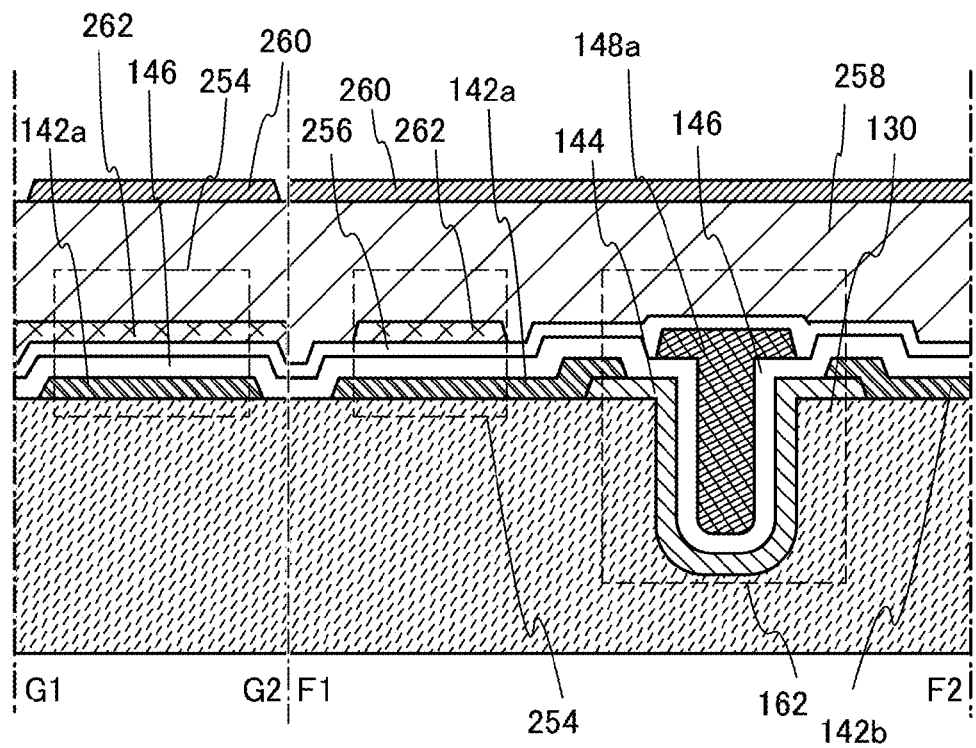
FIGS. 7A and 7B are a cross-sectional view and a plan view illustrating a semiconductor device in an embodiment of the present invention.
Figure 7B:
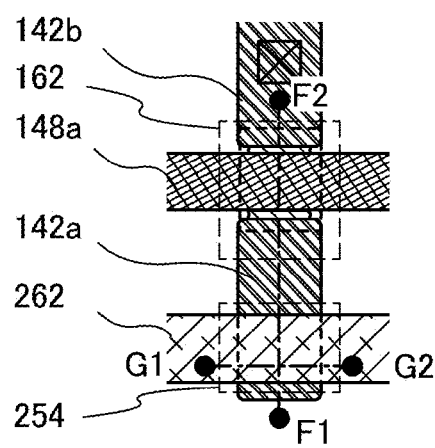

FIGS. 7A and 7B illustrate an example of a structure of the memory cell 250. FIG. 7A is a cross-sectional view of the memory cell 250, and FIG. 7B is a plan view of the memory cell 250. Here, FIG. 7A illustrates a cross section taken along line F1-F2 and line G1-G2 in FIG. 7B.

The transistor 162 illustrated in FIGS. 7A and 7B has the same structure as that described in Embodiment 1 or 2; thus, for description of FIGS. 7A and 7B, the same reference numerals are used for the same parts as those in FIGS. 1A and 1B.

An insulating layer 256 having a single-layer structure or a stacked-layer structure is provided over the transistor 162. In addition, a conductive layer 262 is provided in a region overlapping with the electrode layer 142a of the transistor 162 with the insulating layer 256 interposed therebetween, and the electrode layer 142a, the insulating layer 256, and the conductive layer 262 form a capacitor 254. That is, the electrode layer 142a of the transistor 162 functions as one electrode of the capacitor 254, and the conductive layer 262 functions as the other electrode of the capacitor 254.

An insulating layer 258 is provided over the transistor 162 and the capacitor 254. In addition, a wiring 260 for connecting the memory cell 250 to an adjacent memory cell 250 is provided over the insulating layer 258. Although not illustrated, the wiring 260 is electrically connected to the electrode layer 142b of the transistor 162 through an opening provided in the insulating layer 256, the insulating layer 258, and the like. The wiring 260 may be electrically connected to the electrode layer 142b through another conductive layer provided in the opening. Note that the wiring 260 corresponds to the bit line BL in the circuit diagram of FIG. 6A.

In FIGS. 7A and 7B, the electrode layer 142b of the transistor 162 can also function as a source electrode of a transistor included in an adjacent memory cell. When such a planar layout is employed, the area occupied by the semiconductor device can be reduced; thus, the degree of integration can be increased.

As described above, the plurality of memory cells is formed in the upper portion with the transistors including a crystalline oxide semiconductor (CAAC-OS). Since the off-state current of the transistor including a crystalline oxide semiconductor (CAAC-OS) is small, stored data can be held for a long time owing to such a transistor. In other words, the frequency of the refresh operation can be extremely lowered, which leads to a sufficient reduction in power consumption.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, with a structure where the peripheral circuit and the memory circuit are stacked, the degree of integration of the semiconductor device can be increased.

In addition, by employing the trench structure for the transistor 162, a reduction in the planar area of the transistor 162 can be achieved, so that higher integration can be achieved.

This embodiment can be implemented in appropriate combinations with any of the configurations described in the other embodiments.

(Embodiment 5)

In this embodiment, examples of application of the semiconductor device described in any of the above embodiments to portable devices such as cellular phones, smartphones, or electronic books will be described with reference to FIGS. 8 to 11.

In a portable device such as a cellular phone, a smartphone, or an electronic book, an SRAM or a DRAM is used so as to store image data temporarily. The reason why an SRAM or a DRAM is used is that a flash memory is slow in responding and is not suitable for image processing. On the other hand, an SRAM or a DRAM has the following characteristics when used for temporary storage of image data.

Figure 8A:
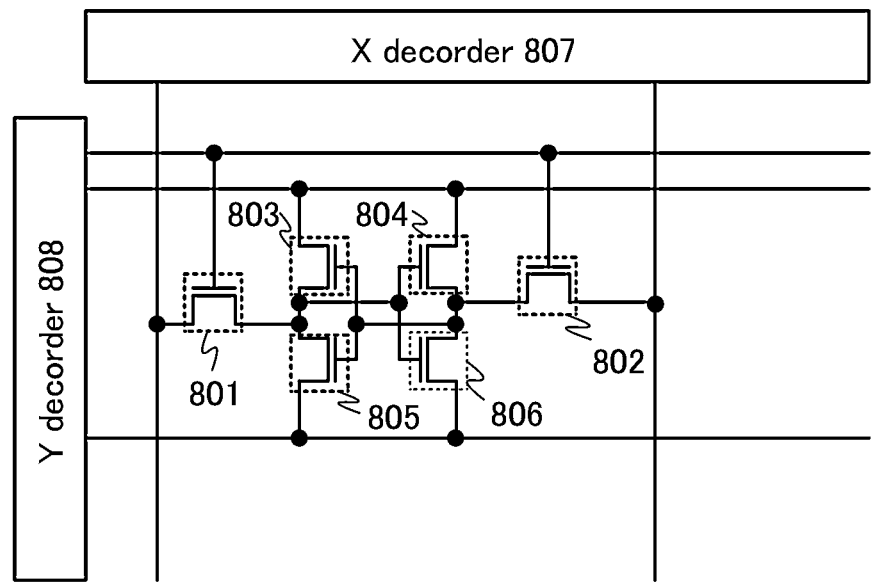
FIGS. 8A and 8B are circuit diagrams each illustrating a semiconductor device in an embodiment of the present invention.

In an ordinary SRAM, as illustrated in FIG. 8A, one memory cell includes six transistors, that is, transistors 801 to 806, which are driven with an X decoder 807 and a Y decoder 808. The transistor 803 and the transistor 805, and the transistor 804 and the transistor 806 form inverters, which enables high-speed driving. However, because one memory cell includes six transistors, a large cell area is one disadvantage. Provided that the minimum feature size of a design rule is F, the area of a memory cell in an SRAM is generally 100 $F^2$ to 150 $F^2$. Therefore, the price per bit of an SRAM is the most expensive among memory devices.

Figure 8B:
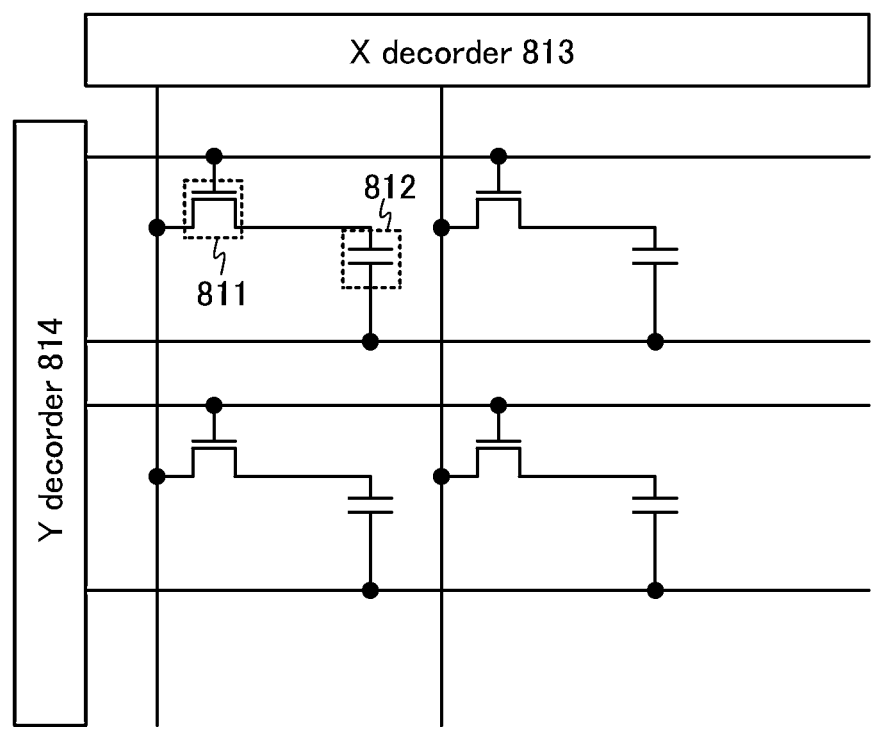

In a DRAM, as illustrated in FIG. 8B, a memory cell includes a transistor 811 and a storage capacitor 812, which are driven with an X decoder 813 and a Y decoder 814. One cell is configured with one transistor and one capacitor and has a small area. The area of a memory cell in a DRAM is generally 10 $F^2$ or less. Note that the DRAM needs to be refreshed periodically and consumes electric power even when a rewriting operation is not performed.

On the other hand, the memory cell of the semiconductor device described in any of the above embodiments has an area of approximately 10 $F^2$ and does not need to be refreshed frequently. Therefore, the area of a memory cell can be decreased, and power consumption can be reduced.

Figure 9:
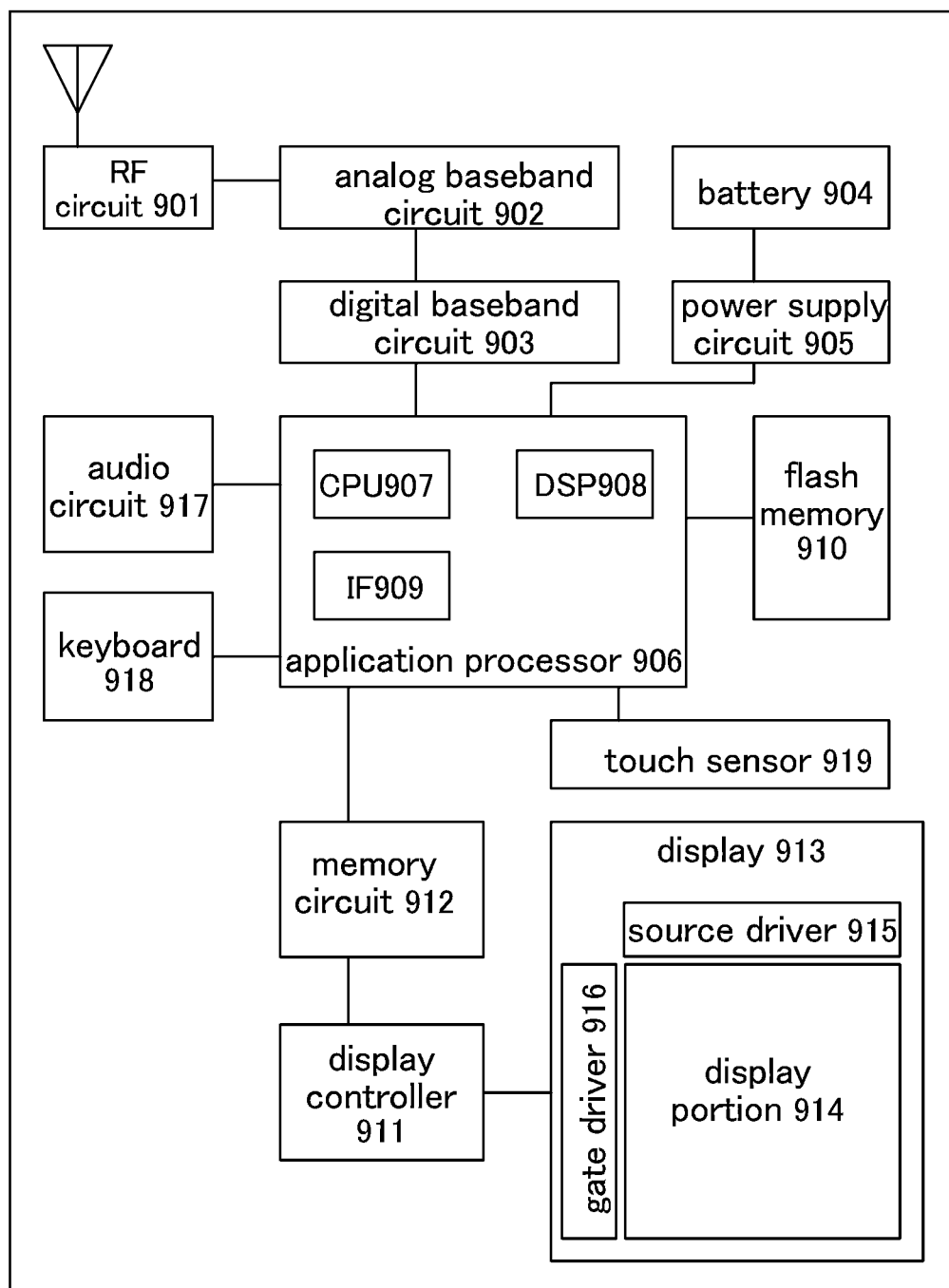
FIG. 9 is a block diagram illustrating a semiconductor device in an embodiment of the present invention.

Next, FIG. 9 is a block diagram of a portable device. The portable device illustrated in FIG. 9 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface (IF) 909. In general, the memory circuit 912 includes an SRAM or a DRAM. By employing the semiconductor device described in any of the above embodiments for that portion, data can be written and read at high speed and can be held for a long time, and power consumption can be sufficiently reduced.

Figure 10:
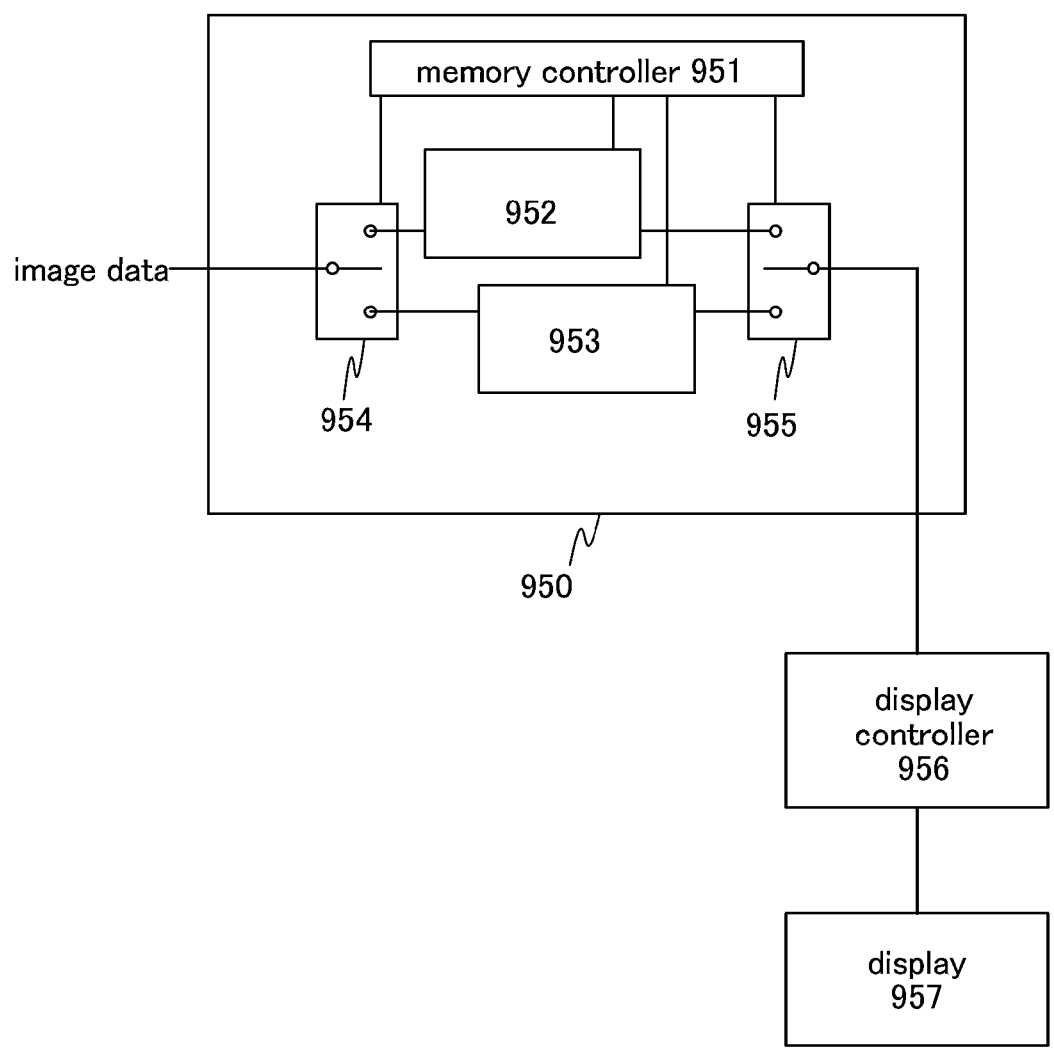
FIG. 10 is a block diagram illustrating a semiconductor device in an embodiment of the present invention.

FIG. 10 illustrates an example of using the semiconductor device described in any of the above embodiments in a memory circuit 950 for a display. The memory circuit 950 illustrated in FIG. 10 includes a memory 952, a memory 953, a switch 954, a switch 955, and a memory controller 951. The memory circuit 950 is connected to a display controller 956 that reads and controls image data input through a signal line (input image data) and data stored in the memory 952 and the memory 953 (stored image data), and is also connected to a display 957 that displays an image based on a signal input from the display controller 956.

First, image data (input image data A) is produced by an application processor (not illustrated). The input image data A is stored in the memory 952 through the switch 954. Then, the image data stored in the memory 952 (stored image data A) is transmitted to the display 957 through the switch 955 and the display controller 956, and is displayed on the display 957.

When the input image data A remains unchanged, the stored image data A is read from the memory 952 through the switch 955 by the display controller 956 normally at a frequency of approximately 30 Hz to 60 Hz.

Next, for example, when a user performs an operation to rewrite a screen (i.e., when the input image data A is changed), the application processor produces new image data (input image data B). The input image data B is stored in the memory 953 through the switch 954. Also during that time, the stored image data A is regularly read from the memory 952 through the switch 955. After the completion of storing the new image data (the stored image data B) in the memory 953, from the next frame for the display 957, the stored image data B starts to be read, transmitted to the display 957 through the switch 955 and the display controller 956, and displayed on the display 957. This reading operation continues until the next new image data is stored in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and held for a long time, and power consumption can be sufficiently reduced.

Figure 11:
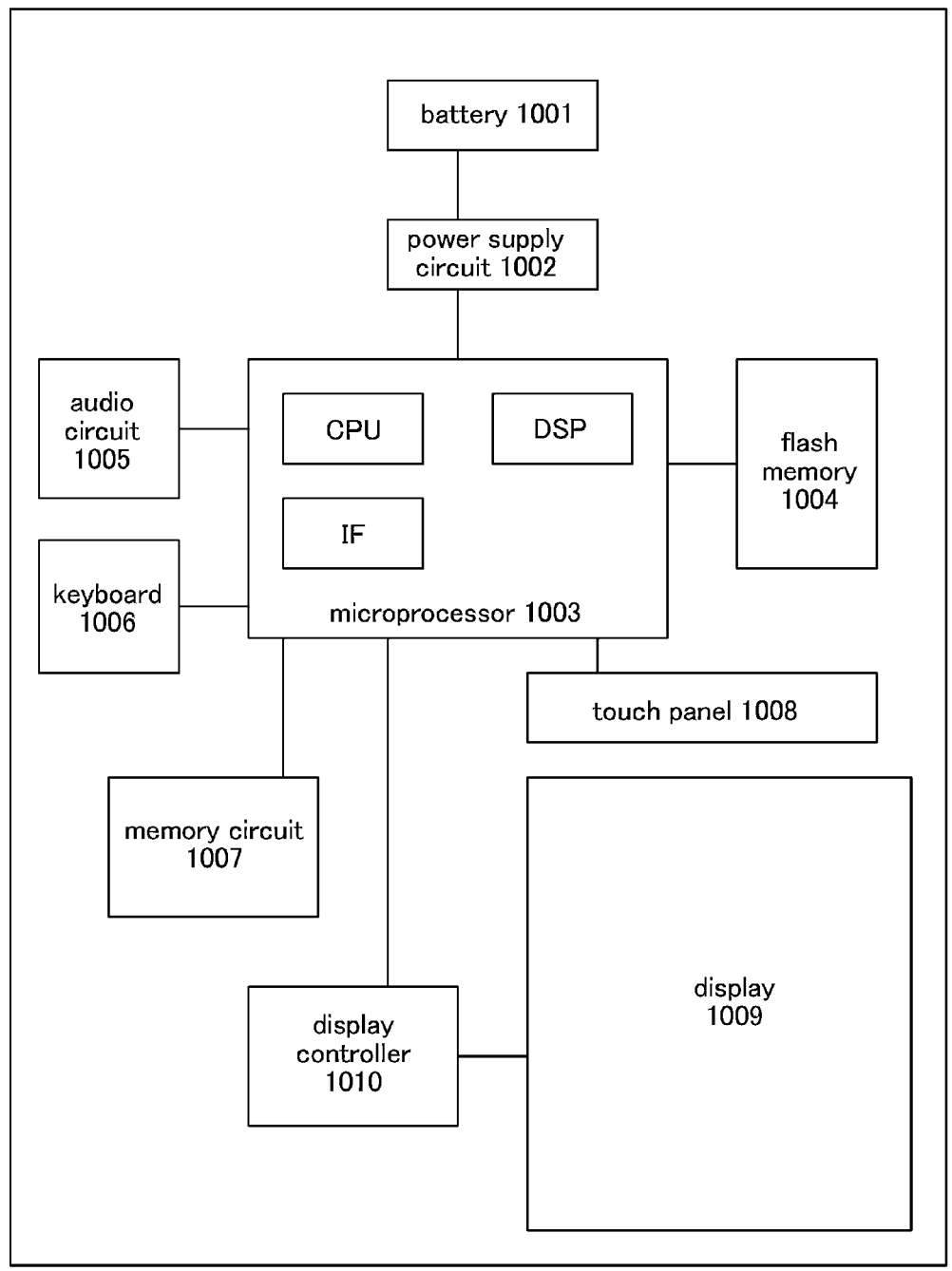
FIG. 11 is a block diagram illustrating a semiconductor device in an embodiment of the present invention.

FIG. 11 is a block diagram of an electronic book. FIG. 11 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 11. The memory circuit 1007 has a function to temporarily hold the contents of a book. For example, when a user uses a highlight function, the memory circuit 1007 stores and holds data of a portion specified by the user. Note that the highlight function is used to make a difference between a specific portion and the other portions while reading an electronic book, by marking the specific portion, e.g., by changing the display color, underlining, making characters bold, changing the font of characters, or the like. In order to store the data for a long time, the data may be copied to the flash memory 1004. Also in such a case, by employing the semiconductor device described in any of the above embodiments, data can be written and read at high speed and held for a long time, and power consumption can be sufficiently reduced.

As described above, the portable devices described in this embodiment each incorporate the semiconductor device according to any of the above embodiments. Therefore, it is possible to obtain a portable device which is capable of reading data at high speed, holding data for a long time, and reducing power consumption.

The configurations, methods, and the like described in this embodiment can be combined as appropriate with any of the configurations, methods, and the like described in the other embodiments.

EXAMPLE 1

In this example, samples were manufactured in each of which an insulating layer having a trench was formed and an oxide semiconductor film was formed along the trench, and the crystal state of the oxide semiconductor film was observed.

First, two kinds of samples, an example sample 1 and an example sample 2, were manufactured as the samples through different manufacturing processes.

In each of the example samples 1 and 2, a silicon oxide film having a thickness of 500 nm was formed as the insulating layer over a silicon substrate by a sputtering method.

The silicon oxide film was formed using a silicon oxide ($SiO_2$) target as a target under the conditions where the distance between the silicon substrate and the target was 60 mm, the pressure was 0.4 Pa, the power of the power source was 2 kW, the atmosphere was an argon and oxygen atmosphere (the argon flow rate was 25 sccm, and the oxygen flow rate was 25 sccm), and the substrate temperature was 100° C.

A resist mask was formed over the silicon oxide film through a photolithography process, and the trench was formed by etching the silicon oxide film using the resist mask. The etching step was performed using an inductively coupled plasma (ICP) etching method under the conditions where the etching gas was trifluoromethane ($CHF_3$), helium (He), and methane ($CH_4$) ($CHF_3$:He:$CH_4$=22.5 sccm: 127.5 sccm: 5 sccm), the power of the power source was 475 W, the bias power was 300 W, the pressure was 3.5 Pa, and the treatment time was 96 seconds. Note that the etching step was followed by ashing with oxygen (with a power of the power source of 200 W under a pressure of 67 Pa (0.5 Torr) for 300 seconds). In a cross section of the trench, the sum of twice the length of the side surface (inner wall) (the depth d of the trench in FIG. 1B) and the length of the bottom (the length L in FIG. 1B) were about 350 nm.

The resist mask was removed from above the silicon oxide film using a stripping solution, and the oxide semiconductor film was formed on the silicon oxide film in contact with a bottom surface, a lower end corner portion, and an inner wall surface of the trench. An In—Ga—Zn—O film having a thickness of 40 nm was formed as the oxide semiconductor film by a sputtering method.

In the example sample 1, the oxide semiconductor film was formed while the substrate was heated to 400° C. Note that the In—Ga—Zn—O film in the example sample 1 was formed using an oxide target having a composition ratio of In:Ga:Zn=1:1:1 [atomic ratio] under the conditions where the distance between the silicon substrate and the target was 60 mm, the pressure was 0.4 Pa, the direct-current (DC) power was 0.5 kW, the atmosphere was an argon and oxygen atmosphere (the argon flow rate was 30 sccm, and the oxygen flow rate was 15 sccm), and the substrate temperature was 400° C. It is preferable that argon and oxygen used for formation of the oxide semiconductor film do not contain water, hydrogen, and the like. For example, it is preferable that argon have a purity of 9N, a dew point of −121° C., a water content of 0.1 ppb, and a hydrogen content of 0.5 ppb and oxygen have a purity of 8N, a dew point of −112° C., a water content of 1 ppb, and a hydrogen content of 1 ppb.

On the other hand, in the example sample 2, the oxide semiconductor film was formed while the substrate was heated to 200° C., and then subjected to heat treatment at 600° C. for one hour in a nitrogen atmosphere. Note that the In—Ga—Zn—O film in the example sample 2 was formed using an oxide target having a composition ratio of In:Ga:Zn=1:1:1 [atomic ratio] under the conditions where the distance between the silicon substrate and the target was 60 mm, the pressure was 0.4 Pa, the direct-current (DC) power was 0.5 kW, the atmosphere was an argon and oxygen atmosphere (the argon flow rate was 30 sccm, and the oxygen flow rate was 15 sccm), and the substrate temperature was 200° C.

Figure 12A:
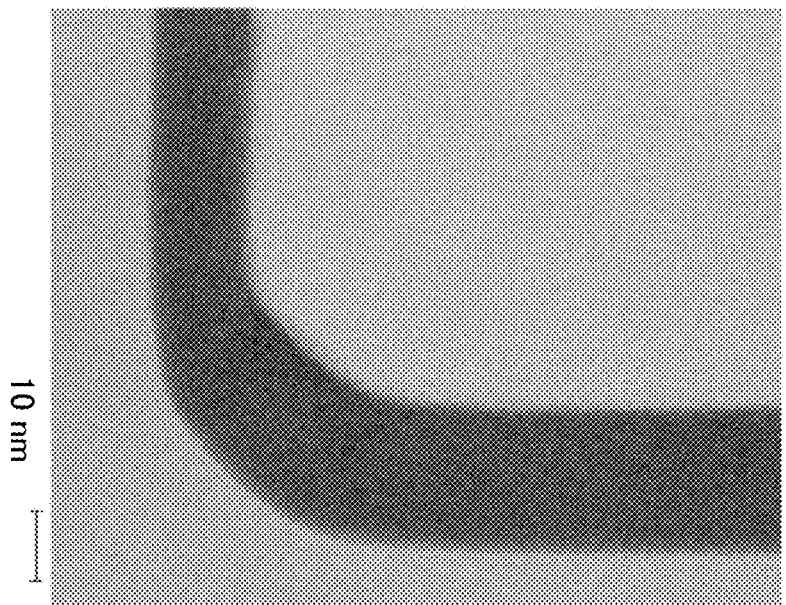
FIGS. 12A and 12B show TEM images of an example sample 1 in Example.
Figure 12B:
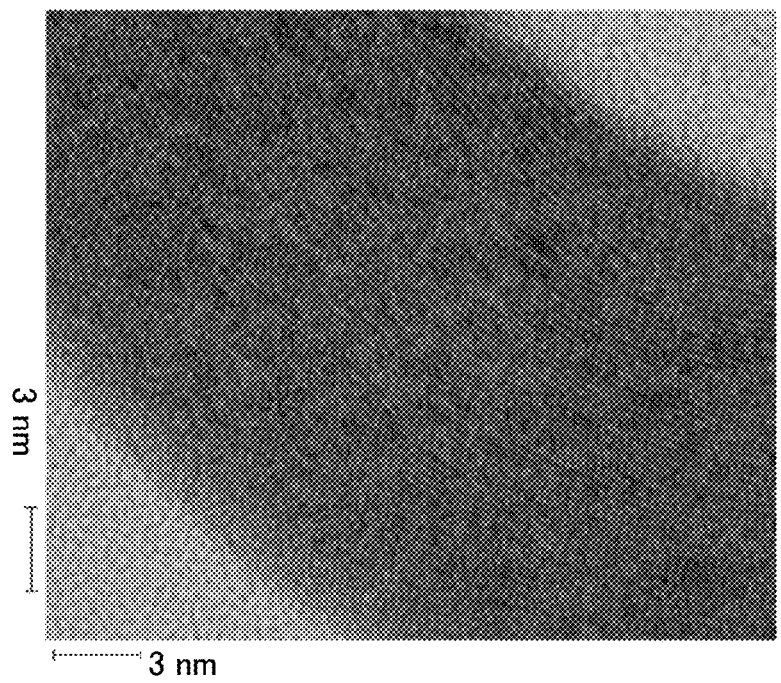
Figure 13A:
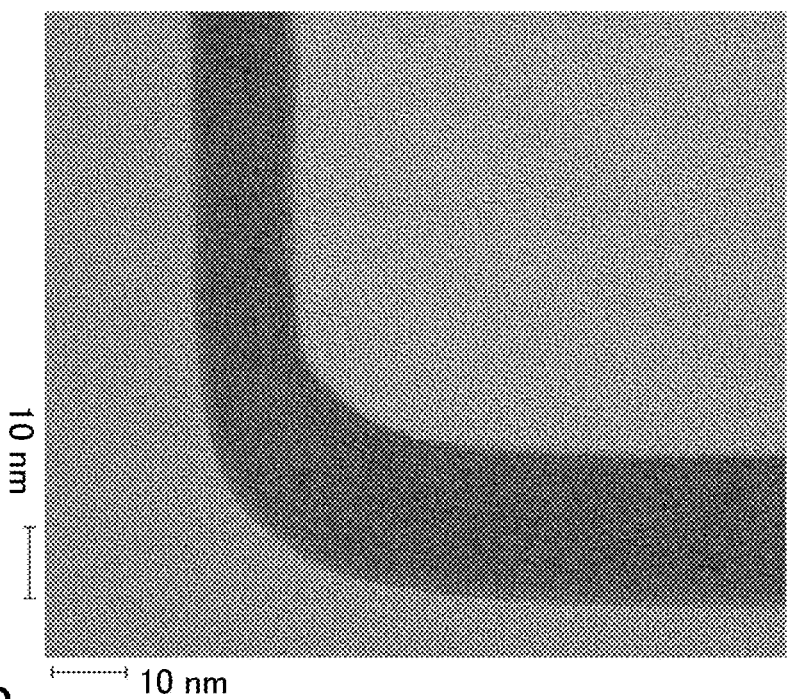
FIGS. 13A and 13B show TEM images of an example sample 2 in Example.
Figure 13B:
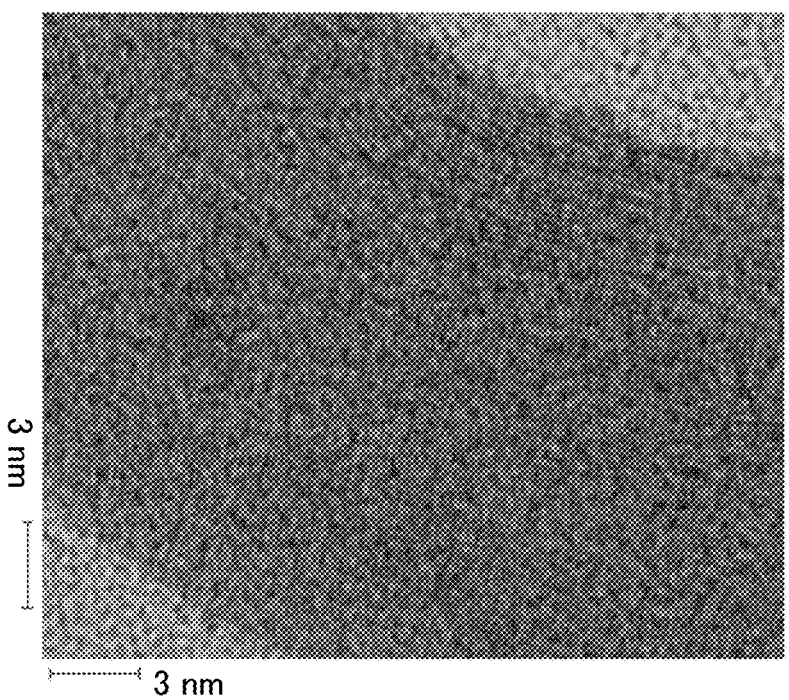

Each of the example samples 1 and 2 obtained through the above steps was cut to expose a cross-section of the lower end corner portion, and the cross-section was observed with a high-resolution transmission electron microscope (TEM: "H9000-NAR" manufactured by Hitachi High-Technologies Corporation) at an acceleration voltage of 300 kV. FIG. 12A shows a TEM image of the example sample 1 at a magnification of 2 million times, and FIG. 12B shows a TEM image of the example sample 1 at a magnification of 8 million times. FIG. 13A shows a TEM image of the example sample 2 at a magnification of 2 million times, and FIG. 13B shows a TEM image of the example sample 2 at a magnification of 8 million times.

As shown in each of FIGS. 12A and 13A, the lower end corner portion of the trench has a curved shape, and its curvature radius is longer than or equal to 20 nm and shorter than or equal to 30 nm. In the lower end corner portion having a curved shape, an In—Ga—Zn—O film (CAAC-OS film) including a crystal having a c-axis substantially perpendicular to a surface can be identified. The crystal having a c-axis substantially perpendicular to a surface is more clearly shown in FIGS. 12B and 13B at a higher magnification, and in the In—Ga—Zn—O film, layered crystalline In—Ga—Zn—O can be identified along the curved surface of the lower end corner portion.

This confirms that the oxide semiconductor film formed in contact with the lower end corner portion in each of the example samples 1 and 2 is a crystalline oxide semiconductor film including a crystal having a c-axis substantially perpendicular to a surface (a CAAC-OS film), and a growth surface of the CAAC-OS film has continuity over the lower end corner portion having a curved shape.

In such a transistor in which a crystalline oxide semiconductor film including a crystal having a c-axis substantially perpendicular to a surface (a CAAC-OS film) is provided along a trench, changes of electrical characteristics of the transistor due to irradiation with visible light or ultraviolet light can be suppressed and the occurrence of a short-channel effect can be further suppressed. Therefore, a highly reliable miniaturized semiconductor device can be provided.

This application is based on Japanese Patent Application serial no. 2011-095607 filed with Japan Patent Office on Apr. 22, 2011, the entire contents of which are hereby incorporated by reference.

What is claimed is:

1. A semiconductor device comprising:
an insulating film; and
a semiconductor film over the insulating film,
wherein the semiconductor film comprises an oxide semiconductor,
wherein the insulating film includes a portion with a curved surface,
wherein the semiconductor film comprises a curved portion including a first curved surface and a second curved surface,
wherein the first curved surface of the curved portion of the semiconductor film is in contact with the curved surface of the portion of the insulating film,
wherein a curvature radius of the first curved surface of the curved portion of the semiconductor film is longer than or equal to 20 nm and shorter than or equal to 60 nm,
wherein the first curved surface of the curved portion of the semiconductor film is located inside the curved surface of the portion of the insulating film,
wherein the curved portion of the semiconductor film comprises a channel formation region,
wherein the first curved surface and the second curved surface of the curved portion of the semiconductor film are opposite to each other,
wherein the channel formation region is located between the first curved surface and the second curved surface of the curved portion of the semiconductor film, and
wherein the semiconductor film has a crystalline region including crystals whose c-axes are substantially parallel to a normal vector of the curved surface of the portion of the insulating film.

2. The semiconductor device according to claim 1, wherein the oxide semiconductor contains indium.

3. The semiconductor device according to claim 1, wherein a curvature radius of the curved surface of the portion of the insulating film is longer than or equal to 20 nm and shorter than or equal to 60 nm.

4. The semiconductor device according to claim 1, wherein the insulating film is an oxide insulating film which contains oxygen in excess of a stoichiometric composition.

5. The semiconductor device according to claim 4, wherein the insulating film is a silicon oxide film whose composition formula is $SiO_{2+\alpha}$ ($\alpha > 0$).

6. The semiconductor device according to claim 1, wherein a carrier concentration in the semiconductor film is lower than $1 \times 10^{14}/cm^3$.

7. The semiconductor device according to claim 1, wherein a hydrogen concentration in the semiconductor film is $5 \times 10^{19}$ atoms/$cm^3$ or less.

8. The semiconductor device according to claim 1, wherein the portion of the insulating film with the curved surface is an end corner portion of a trench provided in the insulating film.

9. A semiconductor device comprising:
an insulating film;
a semiconductor film over the insulating film;
a gate insulating film;
a gate electrode adjacent to the semiconductor film with the gate insulating film interposed therebetween; and
a source electrode and a drain electrode electrically connected to the semiconductor film,
wherein the semiconductor film comprises an oxide semiconductor,
wherein the insulating film includes a portion with a curved surface,
wherein the semiconductor film comprises a curved portion including a first curved surface and a second curved surface,
wherein the first curved surface of the curved portion of the semiconductor film is in contact with the curved surface of the portion of the insulating film,
wherein a curvature radius of the first curved surface of the curved portion of the semiconductor film is longer than or equal to 20 nm and shorter than or equal to 60 nm,
wherein the first curved surface of the curved portion of the semiconductor film is located inside the curved surface of the portion of the insulating film,
wherein the curved portion of the semiconductor film comprises a channel formation region,
wherein the first curved surface and the second curved surface of the curved portion of the semiconductor film are opposite to each other,
wherein the channel formation region is located between the first curved surface and the second curved surface of the curved portion of the semiconductor film, and
wherein the semiconductor film has a crystalline region including crystals whose c-axes are substantially parallel to a normal vector of the curved surface of the portion of the insulating film.

10. The semiconductor device according to claim 9, wherein the oxide semiconductor contains indium.

11. The semiconductor device according to claim 9, wherein a curvature radius of the curved surface of the portion of the insulating film is longer than or equal to 20 nm and shorter than or equal to 60 nm.

12. The semiconductor device according to claim 9, wherein the insulating film is an oxide insulating film which contains oxygen in excess of a stoichiometric composition.

13. The semiconductor device according to claim 12, wherein the insulating film is a silicon oxide film whose composition formula is $SiO_{2+\alpha}$ ($\alpha > 0$).

14. The semiconductor device according to claim 9, wherein an off-state current of the semiconductor device is less than or equal to 100 yA/μm at room temperature.

15. The semiconductor device according to claim 9, wherein a carrier concentration in the semiconductor film is lower than $1 \times 10^{14}/\text{cm}^3$.

16. The semiconductor device according to claim 9, wherein a hydrogen concentration in the semiconductor film is $5 \times 10^{19}$ atoms/cm$^3$ or less.

17. The semiconductor device according to claim 9, wherein the portion of the insulating film with the curved surface is an end corner portion of a trench provided in the insulating film.

18. An electronic device comprising the semiconductor device according to claim 9, wherein the electronic device is selected from the group consisting of an electronic book, a cellular phone and a smartphone.

19. A semiconductor device comprising:
an insulating film;
a semiconductor film over the insulating film;
a gate insulating film;
a gate electrode adjacent to the semiconductor film with the gate insulating film interposed therebetween; and
a source electrode and a drain electrode electrically connected to the semiconductor film,
wherein the semiconductor film comprises an oxide semiconductor,
wherein the insulating film includes a portion with a curved surface,
wherein the semiconductor film comprises a curved portion including a first curved surface and a second curved surface,
wherein the first curved surface of the curved portion of the semiconductor film is in contact with the curved surface of the portion of the insulating film,
wherein a curvature radius of the first curved surface of the curved portion of the semiconductor film is longer than or equal to 20 nm and shorter than or equal to 60 nm,
wherein the first curved surface of the curved portion of the semiconductor film is located inside the curved surface of the portion of the insulating film,
wherein the curved portion of the semiconductor film comprises a channel formation region,
wherein the semiconductor film has a crystalline region including crystals whose c-axes are substantially parallel to a normal vector of the curved surface of the portion of the insulating film,
wherein the first curved surface and the second curved surface of the curved portion of the semiconductor film are opposite to each other,
wherein the channel formation region is located between the first curved surface and the second curved surface of the curved portion of the semiconductor film, and
wherein the crystalline region of the semiconductor film including a region where an oxygen content is higher than that in a stoichiometric composition of the oxide semiconductor in a crystalline state.

20. The semiconductor device according to claim 19, wherein the oxide semiconductor contains indium.

21. The semiconductor device according to claim 19, wherein a curvature radius of the curved surface of the portion of the insulating film is longer than or equal to 20 nm and shorter than or equal to 60 nm.

22. The semiconductor device according to claim 19, wherein a carrier concentration in the semiconductor film is lower than $1 \times 10^{14}/\text{cm}^3$.

23. The semiconductor device according to claim 19, wherein a hydrogen concentration in the semiconductor film is $5 \times 10^{19}$ atoms/cm$^3$ or less.

24. The semiconductor device according to claim 19, wherein an off-state current of the semiconductor device is less than or equal to 100 yA/μm at room temperature.

25. The semiconductor device according to claim 19, wherein the portion of the insulating film with the curved surface is an end corner portion of a trench provided in the insulating film.

26. An electronic device comprising the semiconductor device according to claim 19, wherein the electronic device is selected from the group consisting of an electronic book, a cellular phone and a smartphone.

27. The semiconductor device according to claim 1, wherein the curved surface of the insulating film has an average surface roughness of more than or equal to 0.1 nm and less than 0.5 nm.

28. The semiconductor device according to claim 9, wherein the curved surface of the insulating film has an average surface roughness of more than or equal to 0.1 nm and less than 0.5 nm.

29. The semiconductor device according to claim 19, wherein the curved surface of the insulating film has an average surface roughness of more than or equal to 0.1 nm and less than 0.5 nm.

\* \* \* \* \*